US011258025B2

(12) United States Patent
Friend et al.

(10) Patent No.: US 11,258,025 B2
(45) Date of Patent: Feb. 22, 2022

(54) ELECTROLUMINESCENT DEVICE

(71) Applicant: CAMBRIDGE ENTERPRISE LIMITED, Cambridge (GB)

(72) Inventors: Richard Henry Friend, Fulbourn (GB); Reza Saberi Moghaddam, Cambridge (GB); Zhi Kuang Tan, Singapore (SG); Aditya Sadhanala, New Panvel (IN); May Ling Lai, Cambridgeshire (GB); Pablo Docampo, Newcastle upon Tyne (GB); Felix Deschler, Cambridge (GB); Michael Price, Cambridgeshire (GB); Fabian Hanusch, Munich (DE); Henry Snaith, Oxfordshire (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 569 days.

(21) Appl. No.: 15/307,780

(22) PCT Filed: Apr. 29, 2015

(86) PCT No.: PCT/EP2015/059419
§ 371 (c)(1),
(2) Date: Oct. 28, 2016

(87) PCT Pub. No.: WO2015/166006
PCT Pub. Date: Nov. 5, 2015

(65) Prior Publication Data
US 2017/0054099 A1   Feb. 23, 2017

(30) Foreign Application Priority Data

Apr. 30, 2014 (GB) .................................. 1407606

(51) Int. Cl.
| H01L 51/54 | (2006.01) |
|---|---|
| H01L 51/50 | (2006.01) |
| H01L 51/52 | (2006.01) |
| H01L 51/56 | (2006.01) |
| H01L 51/00 | (2006.01) |
| H01L 51/42 | (2006.01) |

(52) U.S. Cl.
CPC ...... *H01L 51/5012* (2013.01); *H01L 51/5088* (2013.01); *H01L 51/5092* (2013.01); *H01L 51/5203* (2013.01); *H01L 51/56* (2013.01); *C08G 2261/1424* (2013.01); *C08G 2261/3142* (2013.01); *C08G 2261/3221* (2013.01); *C08G 2261/3223* (2013.01); *C08G 2261/512* (2013.01); *C08G 2261/95* (2013.01); *H01L 51/004* (2013.01); *H01L 51/005* (2013.01); *H01L 51/0035* (2013.01); *H01L 51/0037* (2013.01); *H01L 51/0038* (2013.01); *H01L 51/0039* (2013.01); *H01L 51/0072* (2013.01); *H01L 51/0077* (2013.01); *H01L 51/4226* (2013.01)

(58) Field of Classification Search
None
See application file for complete search history.

(56) References Cited

U.S. PATENT DOCUMENTS

| 5,093,698 | A | * | 3/1992 | Egusa | ..................... H05B 33/14 257/40 |
|---|---|---|---|---|---|
| 5,882,548 | A | | 3/1999 | Liang et al. | |
| 6,229,505 | B1 | * | 5/2001 | Fujii | ..................... G09G 3/2011 313/504 |
| 6,420,056 | B1 | | 7/2002 | Chondroudis et al. | |
| 6,831,406 | B1 | | 12/2004 | Fukuyama et al. | |
| 2002/0197511 | A1 | * | 12/2002 | D'Andrade et al. | ... C09K 11/06 428/690 |
| 2008/0251780 | A1 | * | 10/2008 | Li | ......................... B82Y 10/00 257/13 |
| 2011/0121722 | A1 | | 5/2011 | Takashima et al. | |
| 2011/0140091 | A1 | * | 6/2011 | Friend | .................. H01L 51/422 257/40 |
| 2013/0214205 | A1 | | 8/2013 | Vockic et al. | |

FOREIGN PATENT DOCUMENTS

| WO | WO 02/082864 A1 | 10/2002 | |
|---|---|---|---|
| WO | WO 2013/171517 A1 | 11/2013 | |
| WO | WO 2013/171520 A1 | 11/2013 | |
| WO | WO 2014/020499 A1 | 2/2014 | |
| WO | 2014/045021 A1 | 3/2014 | |
| WO | WO-2014045021 A1 * | 3/2014 | ............. C23C 14/06 |
| WO | 2016/009450 A2 | 1/2016 | |

OTHER PUBLICATIONS

Machine translation of WO2002082864 (2002).*
Lanty et al., UV polaritons at room temperature in a microcavity containing perovskites. Journal of Luminescence. 2009; 129:Aug. 1985.
[No Author Listed], Revolutionary solar cells double as lasers. Winton Programme for the Physics of Sustainability. Department of Physics. Last modified Apr. 10, 2014. Retrieved from the internet on Jan. 9, 2017.<https://www.winton.phy.cam.ac.uk/news/solar-cells-double-as-laser >.
Deschler et al., High Photoluminescence Efficiency and Optically Pumped Lasing in Solution-Processed Mixed Halide Perovskite Semiconductors. The Journal of Physical Chemistry Letters. 2014;5:1421-6.

(Continued)

*Primary Examiner* — Andrew K Bohaty
(74) *Attorney, Agent, or Firm* — McCarter & English, LLP; Yu Lu; Zhongyu "Alex" Wang

(57) ABSTRACT

A solid state light-emitting device comprising: a first electrode coupled to a first charge injecting layer; a second electrode coupled to a second charge injecting layer; an emissive layer comprising a perovskite material, wherein the emissive layer is provided between the first and second charge injecting layers; and wherein the bandgaps of the first and second charge injecting layers are larger than the bandgap of the emissive perovskite layer.

44 Claims, 23 Drawing Sheets

(56) References Cited

OTHER PUBLICATIONS

International Search Report and Written Opinion dated Jul. 16, 2015 in connection with International Application No. PCT/EP2015/059419.
International Preliminary Report on Patentability dated Nov. 10, 2016 in connection with International Application No. PCT/EP2015/059419.
Ball et al., Low-temperature processed meso-superstructured to thin-film perovskite solar cells. Energy & Environmental Science. Jan. 1, 2013;6(6):1739.
Smestad et al., Absorptivity as a predictor of the photo luminescence spectra of silicon solar cells and photosynthesis. Solar Energy Materials and Solar Cells. Aug. 1, 1995;38(1/4):57-71.
You et al., Low-Temperature Solution-Processed Perovskite Solar Cells with High Efficiency and Flexibility. ACS Nano. Feb. 25, 2014;8(2):1674-80.
Abrusci et al., High-performance perovskite-polymer hybrid solar cells via electronic coupling with fullerene monolayers. Nano Lett. Jul. 10, 2013;13(7):3124-8.
Burschka et al., Sequential deposition as a route to high-performance perovskite-sensitized solar cells. Nature Jul. 18, 2013;499(7458):316-9.
Choi et al., Structure of methylammonium lead iodide within mesoporous titanium dioxide: active material in high-performance perovskite solar cells. Nano Lett. Jan. 8, 2014;14(1):127-33.
Chondroudis et al., Electroluminescence from an Organic?Inorganic Perovskite Incorporating a Quaterthiophene Dye within Lead Halide Perovskite Layers. Chem Mater. 1999;11(11):3028-30.
Crawford, LEDs for Solid-State Lighting: Performance Challenges and Recent Advances. IEEE Journal of Selected Topics in Quantum Electronics. Jul.-Aug. 2009;15(4):1028-40.
De Mello et al., An improved experimental determination of external photoluminescence quantum efficiency. Advanced Materials. Mar. 1997;9(3):230-2.
Era et al., Organic-inorganic heterostructure electroluminescent device using a layered perovskite semiconductor (C6H5C2H4NH3)2PbI4. Applied Physics Letters. 1994;65(6):676-8.
Greenham et al., Angular Dependence of the Emission from a Conjugated Polymer Light-Emitting Diode: Implications for efficiency calculations. Advanced Materials. Jun. 1994;6(6):491-4.
Hattori et al., Highly efficient electroluminescence from a heterostructure device combined with emissive layered-perovskite and an electron-transporting organic compound. Chemical Physics Letters. May 17, 1996;254:103-8.
Heo et al., Efficient inorganic-organic hybrid heterojunction solar cells containing perovskite compound and polymeric hole conductors. Nature Photonics. May 5, 2013;7:486-91.
Hirasawa et al., Magnetoabsorption of the lowest exciton in perovskite-type compound (CH3NH3)PbI3. Physica B: Dondensed Matter. Jul.-Aug. 1994;201:427-30.
Hwang et al., Photoelectron Spectroscopic Study of the Electronic Band Structure of Polyfluorene and Fluorene-Arylamine Copolymers at Interfaces. J Phys Chem C. Dec. 16, 2006;111(3):1378-84.
Kim et al., Lead Iodide Perovskite Sensitized All-Solid-State Submicron Thin Film Mesoscopic Solar Cell with Efficiency Exceeding 9%. Scientific Reports. Aug. 21, 2012;2(591):1-7.
Lee et al., Efficient Hybrid Solar Cells Based on Meso-Superstructured Organometal Halide Perovskites. Science. Nov. 2, 2012;338(6107):643-7.
Liu et al., Efficient planar heterojunction perovskite solar cells by vapour deposition. Nature. Sep. 19, 2013;501(7467):395-8.
Lu et al., Charge-Carrier Balance and Color Purity in Polyfluorene Polymer Blends for Blue Light-Emitting Diodes. Advanced Functional Materials. Jan. 2012;22(1):144-50.
Matsushima et al., Electroluminescence Enhancement in Dry-Processed Organic-Inorganic Layered Perovskite Films. Japanese Journal of Applied Physics. Mar. 8, 2005;44(1, part 3):1457-61.
Miller et al., Strong Internal and External Luminescence as Solar Cells Approach the Shockley-Queisser Limit. IEEE Journal of Photovoltaics. Jul. 2012;293):303-11.
Noh et al., Chemical management for colorful, efficient, and stable inorganic-organic hybrid nanostructured solar cells. Nano Lett. Apr. 10, 2013;13(4):1764-9.
Ponce et al., Nitride-based semiconductors for blue and green light-emitting devices. Nature. 1997;386:351-9.
Schmidt et al., Nontemplate synthesis of CH3NH3PbBr3 perovskite nanoparticles. J Am Chem Soc. Jan. 22, 2014;136(3):850-3.
Shockley et al., Detailed Balance Limit of Efficiency of p-n Junction Solar Cells. Journal of Applied Physics. 1961;32:510-9.
Stoumpos et al., Semiconducting tin and lead iodide perovskites with organic cations: phase transitions, high mobilities, and near-infrared photoluminescent properties. Inorg Chem. Aug. 5, 2013;52(15):9019-38.
Stranks et al., Electron-hole diffusion lengths exceeding 1 micrometer in an organometal trihalide perovskite absorber. Science. Oct. 18, 2013;342(6156):341-4.
Sun et al., Bright infrared quantum-dot light-emitting diodes through inter-dot spacing control. Nat Nanotechnol. May 6, 2012;7(6):369-73.
Tanaka et al., Comparative study on the excitons in lead-halide-based perovskitetype crystals CH3NH3PbBr3 CH3NH3PbI3. Solid State Communications. 2003;127:619-23.
Tessler et al., Efficient near-infrared polymer nanocrystal light-emitting diodes. Science. Feb. 22, 2002;295(5559):1506-8.
Xing et al., Long-range balanced electron- and hole-transport lengths in organic-inorganic CH3NH3PbI3. Science. Oct. 18, 2013;342(6156):344-7.
Xing et al., Low-temperature solution-processed wavelength-tunable perovskites for lasing. Nat Mater. May 2014;13(5):476-80.
Kitazawa et al., Optical properties of CH3NH3PbX3 (X=halogen) and their mixed-halide crystals. Journal of Materials Science. 2002;37:3585-3587.
Kitazawa, Stability of (C6H5C2H4NH3)2Pb(BrxI4-x) Mixed Crystals. Jp J Appl Phys. 1997;36:6876-6879.
Chen et al., Metal oxides for interface engineering in polymer solar cells. Journal of Materials Chemistry. 2012;22:24202-24212.
Hofle et al., Enhanced electron injection into inverted polymer light-emitting diodes by combined solution-processed zinc oxide/polyethylenimine interlayers. Adv Mater. May 2014;26(17):2750-4.
Tokmoldin, Fabrication and Characterization of Hybrid Metal-Oxide/Polymer Light-Emitting Diodes. Nanostructured Materials and Devices Group Department of Chemistry. Dissertation submitted for the degree of Doctor of Philosophy. Imperial College, London. 201 pages, Nov. 2010.
Mitzi, Templating and structural engineering in organic-inorganic perovskites. J Chem Soc Dalton Trans, pp. 1-12, (2001).
Pode et al., High Efficiency Red Phosphorescent Organic Light-Emitting Diodes with Simple Structure. Organic light emitting diode-material, process and devices. IntechOpen, retrieved online at: https://www.intechopen.com/books/organic-light-emitting-diode-material-process-and-devices/high-efficiency-red-phosphorescent-organic-light-emitting-diodes-with-simple-structure. Chapter 4, 47 pages, (2011).

\* cited by examiner

ELECTROLUMINESCENT DEVICE

CROSS-REFERENCE TO RELATED APPLICATIONS

This application is a National Stage Entry of PCT Patent Application No. PCT/EP2015/059419, filed Apr. 29, 2015 and entitled "Electroluminescent Device," which claims priority to Great Britain Patent Application No. 1407606.1, filed Apr. 30, 2014. The foregoing applications are incorporated herein by reference in their entireties.

FIELD OF THE INVENTION

This invention relates to a solid state light-emitting device, and in particular to a perovskite-based light-emitting diode and related fabrication methods.

BACKGROUND TO THE INVENTION

In its most basic form a light emitting diode (LED) comprises a light emitting layer which is positioned between an anode and a cathode. A hole injection layer may be incorporated between the anode and the light emitting layer (also known as the active or emissive layer). It functions to decrease the energy difference between the work function of the anode and the highest occupied molecular orbital (HOMO) of the light emitting layer, thereby increasing the number of holes introduced into the light emitting layer. Broadly speaking, in operation holes are injected through the anode, and if present the hole injection layer, into the active layer, and electrons are injected into the active layer through the cathode. The holes and electrons combine in the light emitting layer to form an exciton which then undergoes radiative decay to provide light. Equivalently, an electron injection layer between cathode and light-emitting layer can play the same role in controlling the injection of electrons into the light-emitting layer. A further role for these injection layers is to confine carriers within the device, so that under forward electric bias, electrons injected from the cathode into the light-emitting layer are significantly prevented from leaving this layer via the hole-injecting layer, and equivalently, holes injected into the light-emitting layer from the anode are significantly prevented from leaving this layer via the electron-injecting layer.

Some devices also incorporate a thin polymer interlayer between the hole injection layer and the light emitting layer. This plays an important role in improving the device efficiency and the lifetime of LEDs. For example, with an interlayer, blue LEP OLEDs with an external quantum efficiency of greater than 5% can be achieved, which is 35% higher than without the interlayer. It is believed that this may be due to the prevention of exciton quenching at the hole injection layer/light emitting layer interface.

Solid state light-emitting devices based on direct bandgap semiconductors have, over the past two decades, been utilized as energy efficient sources of lighting. However, the fabrication of these devices typically relies on expensive high temperature and high vacuum processes, such as molecular beam epitaxy or thermal sublimation, rendering them uneconomical for use in large area displays. Recent reports on earth-abundant organometal halide based materials with perovskite stoichiometries and crystal structures for high efficiency photovoltaics have demonstrated this class of materials to be excellent semiconductors for optoelectronic devices. Background information can be found in: M. M. Lee et al, *Science* 2012, 338, 643; H.-S. Kim et al, *Sci. Rep.* 2012, 2; J. Burschka et al, *Nature* 2013, 499, 316; M. Liu et al, *Nature* 2013, 501, 395; S. D. Stranks et al, *Science* 2013, 342, 341; G. Xing et al, *Science* 2013, 342, 344; J. Heo et al, *Nat Photon* 2013, 7, 486.

Example advantages of the perovskite class of materials are that they can be very easily solution processed or vacuum deposited under moderate process conditions, require no high temperature heating steps, and they possess an optical bandgap which is tunable in the visible to infrared regions, making them very attractive materials for use in low-cost and large area optoelectronic applications. See for example, C. C. Stoumpos et al, *Inorganic Chemistry* 2013, 52, 9019 and J. H. Noh et al, *Nano Letters* 2013, 13, 1764. Organometal halide based perovskites also possess strong photoluminescent properties, hence making them suitable candidates for use in light-emitting devices. However, electroluminescence could only be achieved at liquid nitrogen temperatures, rendering those devices impractical for applications.

The present applicant has identified a need to develop light-emitting devices in which electroluminescence can be achieved at room temperature.

SUMMARY OF THE INVENTION

Broadly speaking, the present invention provides perovskite-based light-emitting devices (PeLEDs), in which electroluminescence is achieved at room temperature. The applicant has identified a number of device structures or architectures formed using solution-processed perovskites, and which may be used to achieve high brightness near-infrared, green and red electroluminescence. Three example device architectures are described to illustrate the ability to use perovskite at room temperature for light emitting diodes.

Thus, according to a first aspect of the invention, there is provided a solid state light-emitting device comprising: a first electrode coupled to a first charge injecting layer; a second electrode coupled to a second charge injecting layer; an emissive layer comprising a perovskite material, wherein the emissive layer is provided between the first and second charge injecting layers; and wherein the bandgaps of the first and second charge injecting layers are larger than the bandgap of the emissive perovskite layer.

Here, each electrode may be coupled to a charge injecting layer, and the combination of the electrode and charge injecting layer may result in injection of charge into the emissive perovskite layer. The charge injecting layers may actively inject charge, or they may act as a charge transporting layer.

According to a second aspect of the invention, there is provided a solid state light-emitting device comprising: a first electrode coupled to a charge injecting layer; a second electrode; an emissive layer comprising a perovskite material, wherein the emissive layer is provided between the charge injecting layer and the second electrode; and wherein a bandgap of the charge injecting layer is larger than a bandgap of the perovskite layer.

Here, the second electrode may be in direct contact with the emissive perovskite layer, and thus, the second electrode may be considered a second charge injecting layer.

According to a third aspect of the invention, there is provided a solid state light-emitting device comprising: a first electrode coupled to a first charge injecting layer; a second electrode coupled to a second charge injecting layer; an emissive layer comprising a perovskite material, wherein the emissive layer is provided between the first and second charge injecting layers; and wherein the first charge injecting layer is a hole injecting polyelectrolyte, and the second charge injecting layer has a bandgap that is larger than the bandgap of the emissive perovskite layer.

Here, each electrode may be coupled to a charge injecting layer, and the combination of the electrode and charge injecting layer may result in injection of charge into the emissive perovskite layer. Unlike the first aspect of the invention, one of the charge injecting layers is replaced by a hole injecting polyelectrolyte.

The following features apply to all aspects of the invention.

The emissive perovskite layer may be comprised of: a pure perovskite material, pure halide perovskite, pure organometal halide perovskite such as $CH_3NH_3PbI_{3-x}Cl_x$, or $CH_3NH_3PbBr_3$, and/or a mixed perovskite material.

The first electrode may be formed of a transparent conductive material. Thus, the PeLED devices may use a standard device architecture (where electrons are injected from the transparent conductive electrode), or an inverted device architecture (where the transparent conductive electrode is used for hole injection), following the convention adopted in perovskite and dye-sensitised photovoltaics.

In order to confine the injected charges (holes and electrons) within the active (emissive) perovskite layer, the PeLED is formed using a thin perovskite film by forming one or both of the charge injecting layers from a material that has a large bandgap relative to the bandgap of the perovskite layer. Without wishing to be bound by theory, it is believed that the small exciton binding energy in the perovskites causes slow electron-hole capture and associated radiative recombination. An important aspect of the invention is the selection of at least one charge injecting layer having a bandgap that is greater than that of the perovskite layer, and with LUMO and HOMO levels correctly selected, so as to achieve spatial confinement of the electrons and holes in the active perovskite layer, resulting in improved radiative recombination and light emission.

Preferably the perovskite layer is a thin film having a thickness of less than 100 nm; more preferably less than 60 nm, e.g. less than 20 nm. Again without wishing to be bound by theory, it is believed that the confinement of injected charges within the thin "well" enhances electron-hole capture and improves radiative recombination.

At least one of the charge injecting layers may have an optical bandgap of between 1.5 eV and 5 eV.

One or both of the charge injecting layers may be formed of a semiconducting material, and/or of an organic semiconducting material.

One of the charge injecting layers may be a hole injecting organic semiconducting material and may be, for example, selected from the group consisting of PANI (polyaniline), polypyrrole, optionally substituted, doped poly(ethylene dioxythiophene) (PEDOT) and PEDOT:PSS (which is of use as the first charge injecting layer in the third aspect of the present invention).

One of the charge injecting layers may be an electron injecting organic semiconducting material and may be, for example, selected from the group consisting of poly(fluorene)s such as F8, TFB, F8BT and F8-TFB AB copolymer (95:5 F8:TFB).

Alternatively, one of the charge injecting layers may be an electron injecting inorganic semiconducting material and is selected from the group consisting of titanium dioxide ($TiO_2$), zinc oxide (ZnO), magnesium zinc oxide (MgZnO) and aluminium-doped ZnO (AZO).

Alternatively, one of the charge injecting layers may be a hole injecting organic semiconducting material and is selected from the group consisting of polyfluorenes (preferably F8, TFB, PFB or F8-TFB), spiro-OMeTAD, polycarbazoles (preferably poly(9-vinylcarbazole)) and 4,4'-Bis(N-carbazolyl)-1,1'-biphenyl.

One or both of the first and second electrodes may be formed of a transparent conductive material. In embodiments, the first electrode is an anode and the transparent conductive material may be selected from: indium tin oxide (ITO), fluorine doped tin oxide (FTO), indium zinc oxide, graphene, carbon nanotubes, and a metal with a thickness of less than 20 nm.

In one preferred embodiment of the first and second aspects of the present invention, a thin insulating layer may be formed between either or both of the electrodes, or charge injection layers if present and the light-emitting layer. In one embodiment, the insulating layer is preferably formed of an oxide or nitride. More preferably the insulating layer is selected from the group consisting of aluminium oxide, silicon dioxide, silicon nitride, zinc oxide modified with aluminium oxide, nickel oxide or magnesium oxide. The insulating layer may be deposited by any suitable means, e.g. atomic layer deposition, ALD.

In another preferred embodiment, the insulating layer may be formed from an insulating polymer, particularly from the group consisting of poly(ethyleneimine) (PEI), polyethylenimine-ethoxylated (PEI E), polystyrene (PS) or poly(methylmethacrylate) (PMMA).

For example, the transparent conductive electrode material may be coated with a thin layer (preferably <30 nm thick) of an insulating layer selected from the group consisting of aluminium oxide, silicon dioxide, zinc oxide, magnesium oxide, nickel oxide and silicon nitride. The thin scaffold or interlayer may improve the luminescence efficiency of the device, by preventing quenching at the interface between the charge injection layer and the emissive perovskite layer, or by preventing electrons or holes from escaping out of the perovskite layer.

In a further aspect of the invention, there is provided a solid state light-emitting device comprising: a first electrode coupled to a first charge injecting layer; a second electrode coupled to a second charge injecting layer; an emissive layer comprising a perovskite material, wherein the emissive layer is provided between the first and second charge injecting layers; and wherein there is a thin insulating layer formed between either or both of the charge injecting layers and the light-emitting layer.

A further thin layer (e.g. <30 nm thick) of a material selected from molybdenum trioxide and tungsten trioxide may be deposited between: the transparent conductive electrode and the perovskite layer, between a charge injecting layer and a conductive electrode, between the transparent conductive electrode and a charge injecting layer, between the perovskite layer and a charge injecting layer, or between the perovskite layer and a conductive electrode. The further thin layer may increase the charge injection efficiency between layers of the light-emitting device.

As mentioned above, the emissive perovskite layer may comprise an organometal halide perovskite material or a metal halide perovskite material.

The organometal halide perovskite may have an $AMX_3$ structure, where A is a monovalent organic cation or a monovalent metal cation, M is a divalent cation and X is a halide anion.

The divalent cation M may be a divalent metal cation, such as, but not limited to, tin ($Sn^{2+}$) or lead ($Pb^{2+}$).

The monovalent organic cation may be a primary, secondary or tertiary ammonium cation [$HNR^1R^2R^3$], wherein each of $R^1$, $R^2$ and $R^3$ may be the same or different and is selected from hydrogen, an unsubstituted or substituted $C_1$-$C_{20}$ alkyl group and an unsubstituted or substituted $C_5$-$C_{18}$ aryl group. Examples of suitable substituents for the alkyl groups are alkoxy groups having from 1 to 20 carbons atoms, hydroxyl groups, mono and dialkylamino groups wherein each alkyl group may be the same or different and has from 1 to 20 carbon atoms, cyano groups, nitro groups, thiol groups, sulphinyl groups, sulphonyl groups and aryl groups having from 5 to 18 carbon atoms. Examples of suitable substituents for the alkyl groups are alkyl groups having from 1 to 20 carbon atoms, alkenyl and alkynyl groups each having from 2 to 20 carbon atoms, alkoxy groups having from 1 to 20 carbons atoms, haloalkyl groups having from 1 to 20 carbon atoms, hydroxyl groups, mono and dialkylamino groups wherein each alkyl group may be the same or different and has from 1 to 20 carbon atoms, cyano groups, nitro groups, thiol groups, sulphinyl groups and sulphonyl groups.

In embodiments, the monovalent organic cation may be of the form $[R^1R^2N—CH=NR^3R^4]^+$:

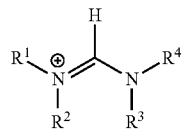

wherein each of $R^1$, $R^2$, $R^3$ and $R^4$ may be the same or different and is selected from hydrogen, an unsubstituted or substituted $C_1$-$C_{20}$ alkyl group and an unsubstituted or substituted $C_5$-$C_{18}$ aryl group.

In embodiments, the monovalent organic cation may be of the form $(R^1R^2N)(R^3R^4N)C=N^+R^5R^6$:

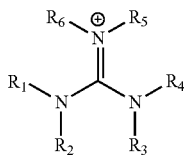

wherein each of $R^1R^2$, $R^3$, $R^4$, $R^5$ and $R^6$ may be the same or different and is selected from hydrogen, an unsubstituted or substituted $C_1$-$C_{20}$ alkyl group and an unsubstituted or substituted $C_5$-$C_{18}$ aryl group.

In embodiments, the monovalent metal cation may be an alkali metal cation.

In embodiments, the monovalent metal cation is caesium ($Cs^+$) or rubidium ($Rb^+$).

The halide anion X may be chosen from chloride, bromide, iodide, and fluoride, and a chalcogenide anion may be chosen from sulphide, selenide, arsenide and telluride.

The halide anion X may be selected from chloride, bromide, iodide, and fluoride and, in the above-mentioned $AMX_3$ structure, each halide may be the same or different.

The organometal halide perovskite material or metal halide perovskite material may have an $A_{1-i}B_iMX_3$ structure, wherein: A and B are each a monovalent organic cation or monovalent metal cation as described above, where A and B are different; M is a divalent metal cation as described above; X is a halide anion as described above; and i is between 0 and 1.

The organometal halide perovskite material or metal halide perovskite material may have an $AMX_{3-k}Y_k$ structure, wherein: A is a monovalent organic cation or a monovalent metal cation as described above; M is a divalent metal cation as described above; X and Y are each a halide anion as described above, where X and Y are different; and k is between 0 and 3.

The organometal halide perovskite material or metal halide perovskite material may have an $AM_{1-j}N_jX_3$ structure, wherein: A is a monovalent organic cation or a monovalent metal cation as described above; M and N are each a divalent metal cation as described above; X is a halide anion as described above; and j is between 0 and 1.

The organometal halide perovskite material or metal halide perovskite material may have an $A_{1-i}B_iM_{1-j}N_jX_{3-k}Y_k$ structure, wherein: A and B are each a monovalent organic cation or a monovalent metal cation as described above, where A and B are different; M and N are each a divalent metal cation as described above; X and Y are each a halide anion as described above, where X and Y are different; and where i is between 0 and 1, j is between 0 and 1, and k is between 0 and 3.

According to a related aspect of the invention, there is provided a method of manufacturing a solid state light-emitting device, the method comprising: providing a first electrode on a substrate; depositing a first charge injecting layer over the first electrode; depositing an emissive perovskite layer over the first charge injecting layer; depositing a second charge injecting layer over the emissive perovskite layer; and depositing a second electrode over the second charge injecting layer; and wherein the bandgaps of the first and second charge injecting layers are larger than the bandgap of the emissive perovskite layer.

The substrate may be formed of a transparent material, preferably glass. The first electrode may be an anode and may be formed by the deposition of a transparent conductive material, preferably indium tin oxide (ITO) or fluorine doped tin oxide (FTO) on the transparent substrate.

The active perovskite layer may be composed of a single, homogenous phase perovskite material, which may help to achieve efficient light emission. The emissive layer may have a thickness of less than 100 nm.

In one preferred embodiment of the method, a thin insulating layer may be deposited between either or both of the charge injecting layers and the light-emitting layer. Preferably, the insulating layer is formed of an oxide or nitride. More preferably the insulating layer is selected from the group consisting of aluminium oxide, silicon dioxide, silicon nitride, nickel oxide or magnesium oxide. The insulating layer may be deposited by any suitable means, e.g. atomic layer deposition, ALD. In another preferred embodiment of the method, the insulating layer may be formed from an insulating polymer, in particular from the group consisting of poly(ethyleneimine) (PEI), polyethylenimine-ethoxylated (PEIE), polystyrene (PS) or poly(methylmethacrylate) (PMMA).

In one preferred embodiment of the method, a thin layer of <30 nm of a material selected molybdenum trioxide and tungsten trioxide is deposited between:
  the transparent conductive electrode and the perovskite layer,
  between a charge injecting layer and a conductive electrode,
  between the transparent conductive electrode and a charge injecting layer,
  between the perovskite layer and a charge injecting layer, or between the perovskite layer and a conductive electrode.

The deposition of the various layers forming the device may be performed using one or more of the following deposition techniques: vacuum thermal evaporation, spin coating, direct-write printing, inkjet printing, lithographic patterning, and solution deposition.

In a further aspect of the invention, there is provided an electronic device comprising an LED display, wherein the display comprises light-emitting devices as described above. The electronic device may be a consumer electronic device, a mobile device such as smartphone or tablet PC, or a display screen/panel.

BRIEF DESCRIPTION OF THE DRAWINGS

The invention is diagrammatically illustrated, by way of example, in the accompanying drawings, in which:

FIG. 3b shows the electroluminescence of the device of FIG. 3a;

DETAILED DESCRIPTION OF THE INVENTION

Broadly speaking, embodiments of the invention relate to perovskite-based light-emitting devices (LEDs), which may be formed using different architectures/device structures.
Example Structure 1

Figure 1A:
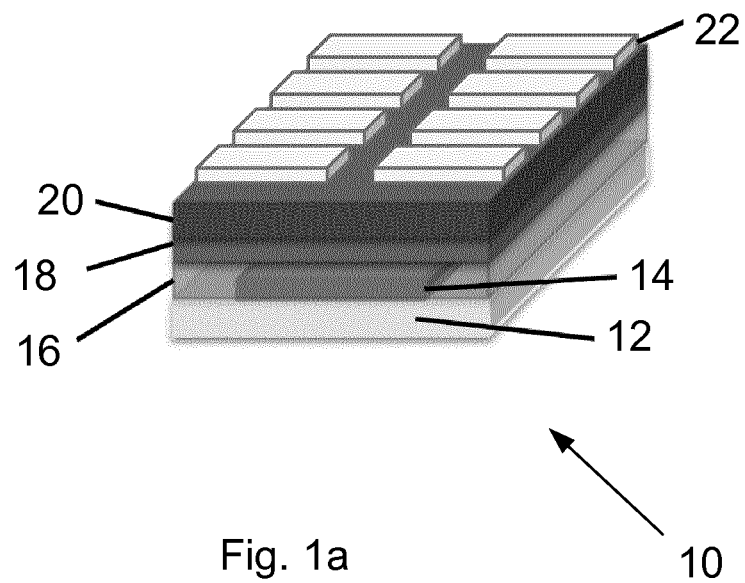
FIG. 1a shows a device architecture comprising $CH_3NH_3PbI_{3-x}Cl_x$ perovskite, according to a first embodiment of the invention.

FIG. 1a shows device architecture 10 according to an embodiment of the invention. The PeLED is fabricated on a transparent substrate 12, which may be a glass substrate.

Generally speaking, the PeLED illustrated here comprises a first electrode 14 coupled to a first charge injecting layer 16, a second electrode 22 coupled to a second charge injecting layer 20, and an active layer 18 formed of an organometal halide perovskite material. The active layer 18 is sandwiched between the first and second charge injecting layers 16, 20. One or both of the charge injecting layers 16, 20 may be formed of a semiconductor material, such as titanium dioxide ($TiO_2$). The active perovskite layer may be formed of $CH_3NH_3PbI_{3-x}Cl_x$ perovskite. Advantageously, the double heterostructure architecture shown here enables the injected charges (holes and electrons) to be confined within the active (emissive) perovskite layer. This may be achieved by forming the PeLED using charge injecting layers 16, 20 from a material that has a large bandgap relative to the bandgap of the perovskite layer, separately chosen for electron and hole confinement. This confinement within the active layer may be improved by use of a thin active perovskite layer, e.g. having a thickness of less than 100 nm (or <60 nm, or even <20 nm). Large bandgap semiconductor materials enables spatial confinement of the electrons and holes in the active layer, and this is enhanced further by use of a thin perovskite layer, resulting in radiative recombination and light emission.

Preferably, the first electrode 14 may be formed of a transparent, conductive material, such as indium tin oxide (ITO). One or both of the first and second charge injecting layers 16, 20 may be formed from a semiconductor, such as titanium dioxide ($TiO_2$), a polymer material such as poly(9, 9'-dioctylfluorene) (F8). One or both of the first and second charge injecting layers 16, 20 may actively inject charge into the active perovskite layer 18, or one or both of layers 16, 20 may simply act as a charge transport and charge blocking layer. The second electrode 22 may be formed of any conductive material such as, but not limited to $MoO_3$/Ag, Ca/Ag, Au etc.

For illustrative purposes, device 10 may be formed of a simple 3-layered structure of $TiO_2/CH_3NH_3PbI_{3-x}Cl_x/F8$, sandwiched between indium tin oxide (ITO) and $MoO_3$/Ag as the first electrode 14 (cathode) and second electrode (anode) 22 respectively. Here, ITO is the cathode and thus, the first charge injecting layer 16 (titanium oxide) transports electrons and injects them into the active perovskite layer 18, while $MoO_3$/Ag is the cathode and the second charge injecting layer 20 (F8) transports the holes and injects them into the active layer 18. In this example, the first and second charge injecting layers 16, 20 are formed from large bandgap semiconductors. The large bandgaps of the semiconductors (relative to the perovskite layer bandgap), enable confinement of the injected charges in the perovskite layer for better light emission. The first charge transport and injecting layer 16 is formed of a thin (25 nm) layer of titanium dioxide ($TiO_2$) that is deposited using atomic layer deposition (ALD) onto an ITO electrode 14 which forms a coating on glass substrate 12. In this case, the $TiO_2$ layer 16 serves as an efficient electron injector, as well as a hole blocking layer for the perovskite device.

A thin layer of perovskite precursor was deposited on the $TiO_2$ by spin coating. Annealing at 100° C. converts the precursor into a 15 nm $CH_3NH_3PbI_{3-x}Cl_x$ perovskite thin film. The perovskite layer 18 was designed to be thin (e.g. <100 nm) in order to spatially confine electrons and holes for radiative recombination. Given the small exciton binding energy in this class of materials, the confinement of injected charges within a thin "well" in the perovskite layer enhances electron-hole capture and improves radiative recombination.

The perovskite film was capped with the second charge injecting layer 20, which was a 50 nm layer of F8 polymer.

The F8 polymer layer 20 has a deep ionization potential and a shallow electron affinity, which advantageously results in the formation of a type-1 heterojunction with the perovskite layer 18. Thus, the F8 material confines holes within the perovskite well, and blocks electrons from exiting via the anode (i.e. the second electrode 22). A high work function $MoO_3$/Ag anode was used to provide ohmic hole injection into the F8 polymer.

Thus, in more detail, ITO coated glass substrates 12 were cleaned successively with acetone and isopropanol. $TiO_2$ (25 nm) was grown onto the cleaned substrates at 225° C. with atomic layer deposition (ALD), using titanium tetrachloride ($TiCl_4$) and water as precursors. The substrates were transferred into a nitrogen filled glovebox for further fabrication. The $CH_3NH_3PbI_3Cl_x$ perovskite precursor solution was spin coated onto the $TiO_2$ at 3000 rpm for 60 seconds, and annealed at 100° C. for 5 minutes to give a thin perovskite film with an average thickness of ~15 nm, as determined by atomic force microscopy (AFM). A solution of F8 in chlorobenzene (10 mg/mL) was spin coated onto the perovskite layer at 3000 rpm for 60 seconds to give a 50 nm film. $MoO_3$ (5 nm) and Ag (100 nm) were successively deposited by vacuum thermal evaporation.

Figure 1B:
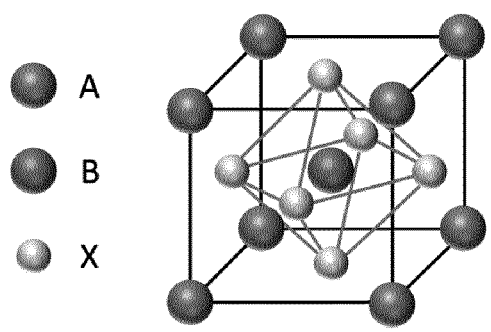
FIG. 1b shows a single unit-cell of an $ABX_3$ perovskite crystal.

FIG. 1b shows a single unit-cell of an $ABX_3$ perovskite crystal. In embodiments, A may be methylammonium, B may be lead, and X may be I, Br or Cl.

Figure 1C:
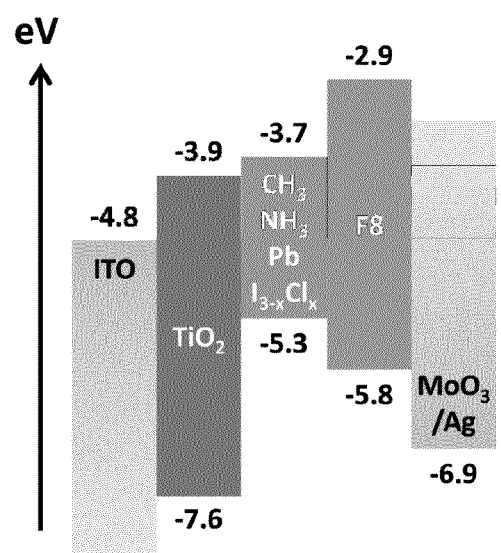
FIG. 1c shows an energy level diagram of different layers of materials in an infra-red perovskite LED (PeLED)

FIG. 1c shows an energy level diagram of different layers of materials in an infra-red PeLED formed using the device structure illustrated in FIG. 1a. In particular, the diagram shows the conduction and valence band levels with respect to vacuum. This demonstrates the higher bandgaps for $TiO_2$ and F8 than for the perovskite layer.

Figure 1D:
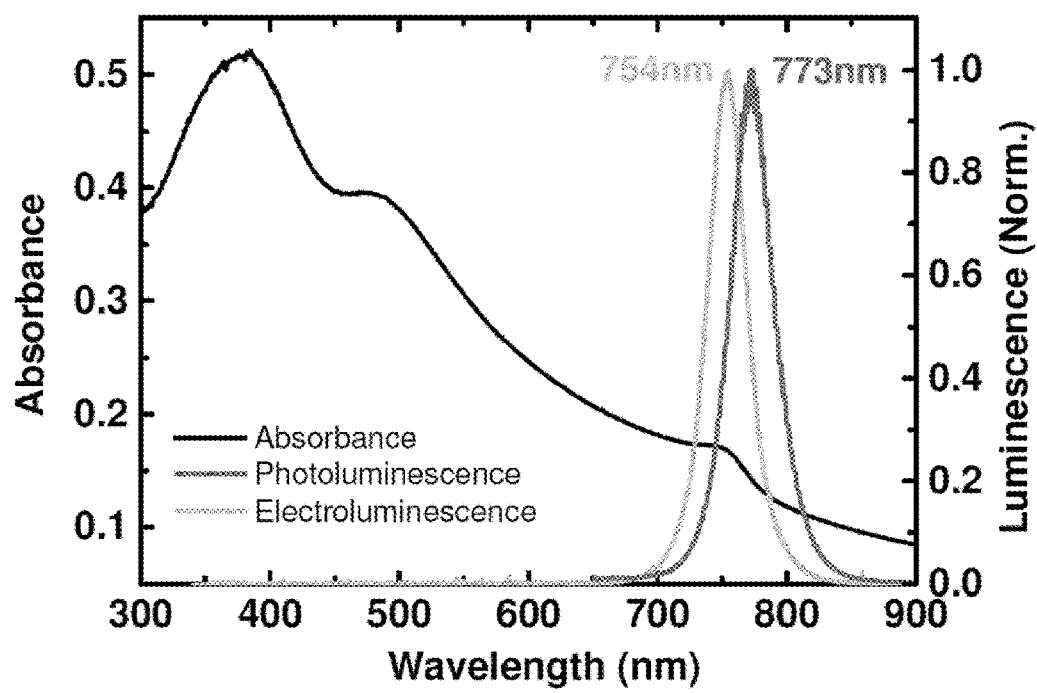
FIG. 1d illustrates absorbance, electroluminescence and photoluminescence spectra of $CH_3NH_3PbI_{3-x}Cl_x$ perovskite.
Figure 1E:
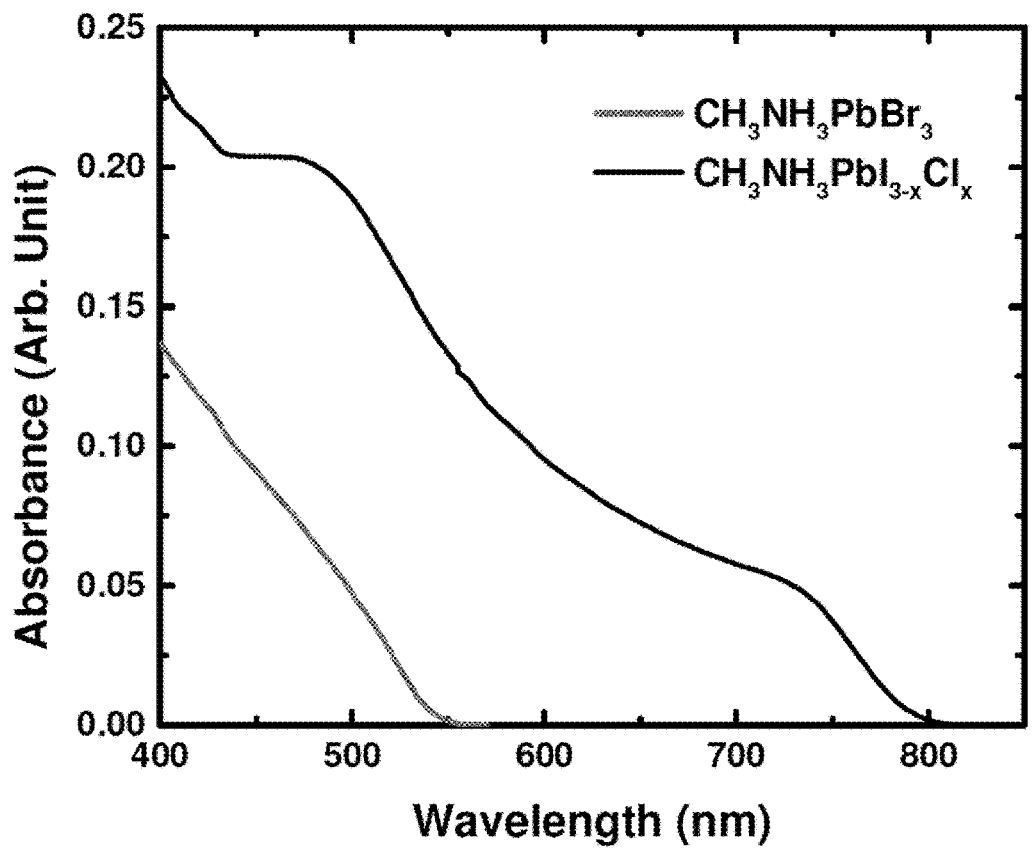
FIG. 1e shows photothermal deflection spectroscopy (PDS) of $CH_3NH_3PbI_{3-x}Cl_x$ and $CH_3NH_3PbBr_3$ perovskite thin films on fused silica substrate, showing the clear absorption edges of the materials.

Turning now to FIG. 1d, this shows a graph of the absorbance, electroluminescence and photoluminescence spectra of $CH_3NH_3PbI_{3-x}Cl_x$ perovskite. Absorption onset occurs at approximately 760 nm, consistent with previous reports such as that of M. M. Lee et al (ibid). The non-zero baseline in the absorption spectra can be attributed to light scattering and interference effects, a clear absorption edge was measured in photothermal deflection spectroscopy (PDS), which is a technique immune to optical scattering artifacts (see FIG. 1e). A strong near-infrared photoluminescence (PL), centered at 773 nm, was measured when the perovskite thin film was excited with a 532 nm green cw-laser. Using the integrating sphere method (described in M. Era, *Applied Physics Letters* 1994, 65, 676) a relatively high photoluminescence quantum efficiency (PLQE) of 26% was measured. The electroluminescence (EL) of the infrared PeLED is slightly blue shifted from the PL, peaking at 754 nm. The emission band is narrow with a full width at half maximum (FWHM) of 35 nm. No electroluminescence was observed from the F8 polymer, indicating that F8 serves only as a hole transporting and an electron blocking layer, and does not participate in light emission.

Figure 7:
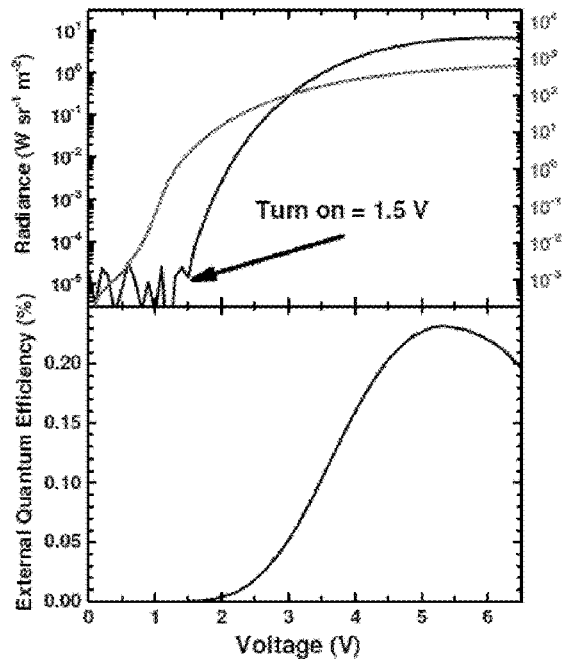
FIG. 7a depicts two graphs, the top graph showing combined radiance and current density against voltage characteristics of an infrared PeLED, the bottom graph showing external quantum efficiency against voltage of PeLED.
FIG. 7b shows a graph of radiance against current density of PeLED under steady state and pulse measurement conditions.
FIG. 7c shows a graph of photoluminescence quantum efficiency (PLQE) of $TiO_2/CH_3NH_3PbI_{3-x}Cl_x/F8$ film as a function of absorbed photon flux.
Figure 7:
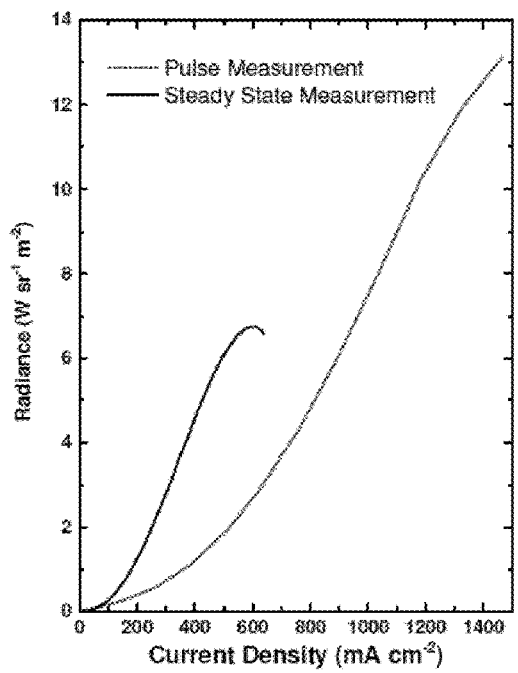
Figure 7:
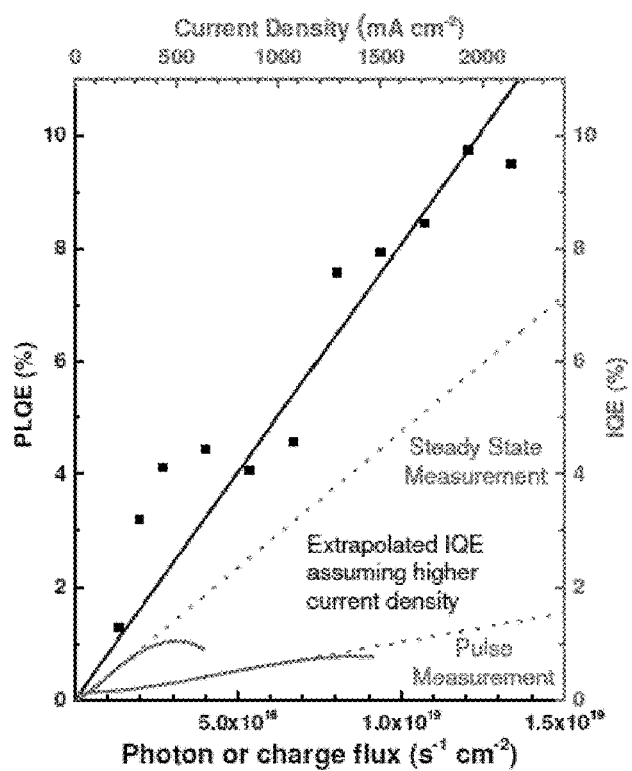

FIG. 7a shows the current density vs. voltage characteristics and the corresponding radiance of the infrared PeLED of FIG. 1a. A clear turn-on of light emission was observed at 1.5 V, close to the photon emission energy. For the best performing device, a radiance of 6.8 W $sr^{-1}$ $m^{-2}$ was achieved at a driving voltage of 6.2 V, where the corresponding current density was 605 mA $cm^{-2}$. This is comparable to some of the best colloidal quantum dot infrared light-emitting devices (see for example, N. Tessler et al, *Science* 2002, 295, 1506, and L. Sun et al, *Nat Nano* 2012, 7, 369). The highest external quantum efficiency (EQE) of 0.23% was achieved at 494 mA cm$^{-2}$, calculated assuming a Lambertian emission profile. This gives an internal quantum efficiency (IQE) of 1.0%, calculated using the relation IQE=2n$^2$ EQE (see N. C. Greenham et al, *Advanced Materials* 1994, 6, 491). We selected the refractive index of glass (n=1.5) to estimate IQE because we consider light to be emitted isotropically into the glass substrate, given the thinness (<<λ) of our emissive perovskite layer. The EQE rises with increasing voltage and current density, indicating that a high density of charges is required for efficient radiative recombination.

To investigate the reasons for the decline in radiance and efficiency beyond 600 mA cm$^{-2}$, pulse voltage measurements were adopted where a bias as high as 14 V was applied to drive currents up to 1500 mA cm$^{-2}$ (see FIG. 7b). Using 14 V square voltage pulses at a width of 1 ms and frequency of 100 Hz, a two-times higher radiance of 13.1 W sr$^{-1}$ m$^{-2}$ was achieved at a current density of 1467 mA cm$^{-2}$. This indicates that the device degradation and efficiency drop-off are driven by heating at high current densities since a higher radiance could be achieved when the device is given time to cool in between the pulses.

Figure 8:
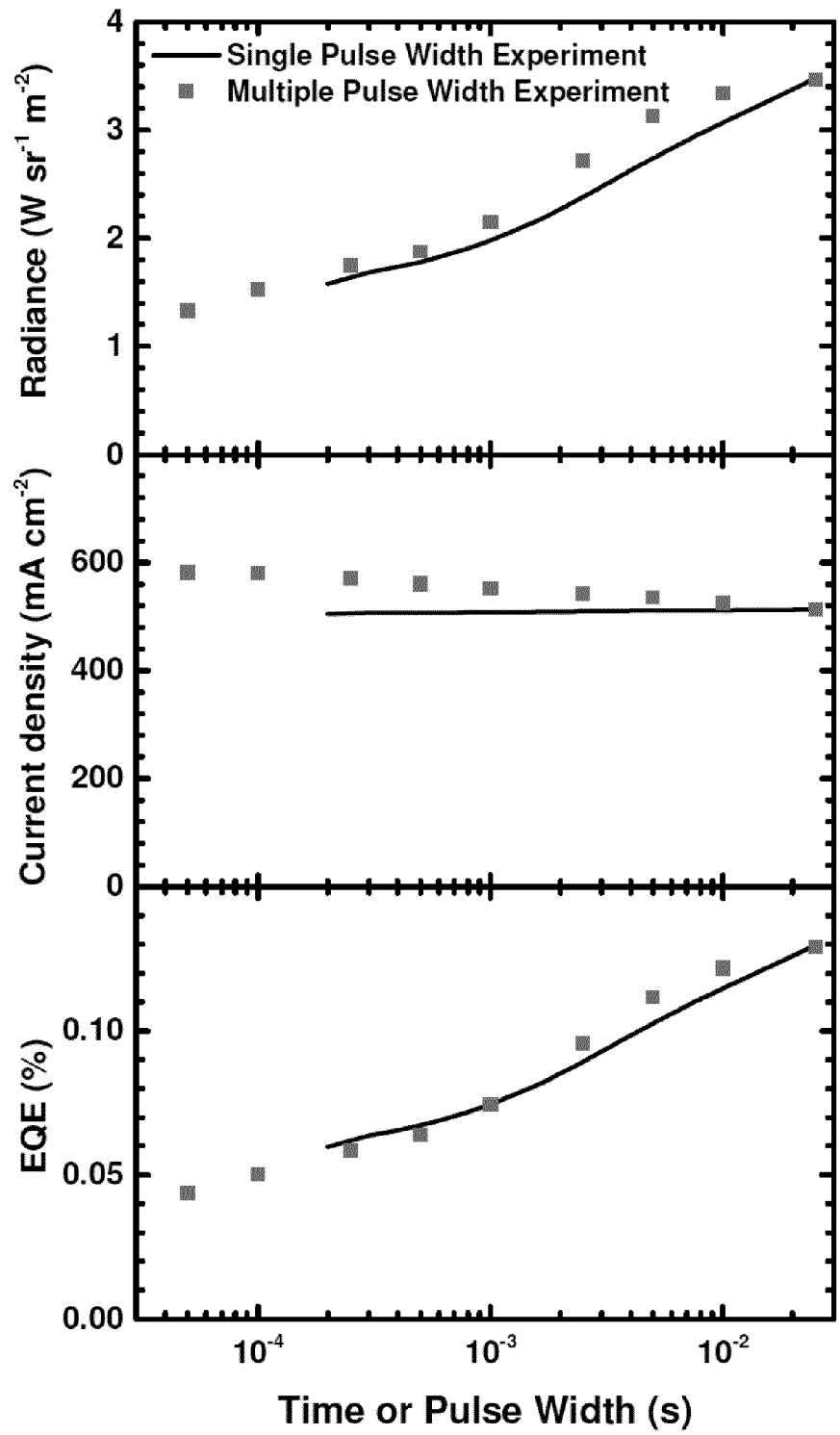
FIG. 8 shows plots of radiance, current density and external quantum efficiency vs. time (or pulse width) for the $CH_3NH_3PbI_{3-x}Cl_x$ PeLED at a driving voltage of 7 V.

Interestingly, during the pulse experiments it was observed that the radiance and quantum efficiency of the PeLED increase across the duration of the voltage pulse, while the current density remains approximately constant. FIG. 8 shows plots of radiance, current density and external quantum efficiency vs. time (or pulse width) for the CH$_3$NH$_3$PbI$_{3-x}$Cl$_x$ PeLED at a driving voltage of 7 V. In the single pulse width experiment, 25 ms square voltage pulses with a period of 250 ms were applied and the radiance and current density were monitored over the duration of the 25 ms pulse. For the multiple pulse width experiment, square pulses with widths ranging from 50 µs to 25 ms were applied to the device, all with periods of 10× pulse width. Both experiments show that radiance and EQE increase with the pulse width while current density remains approximately constant.

Figure 9A:
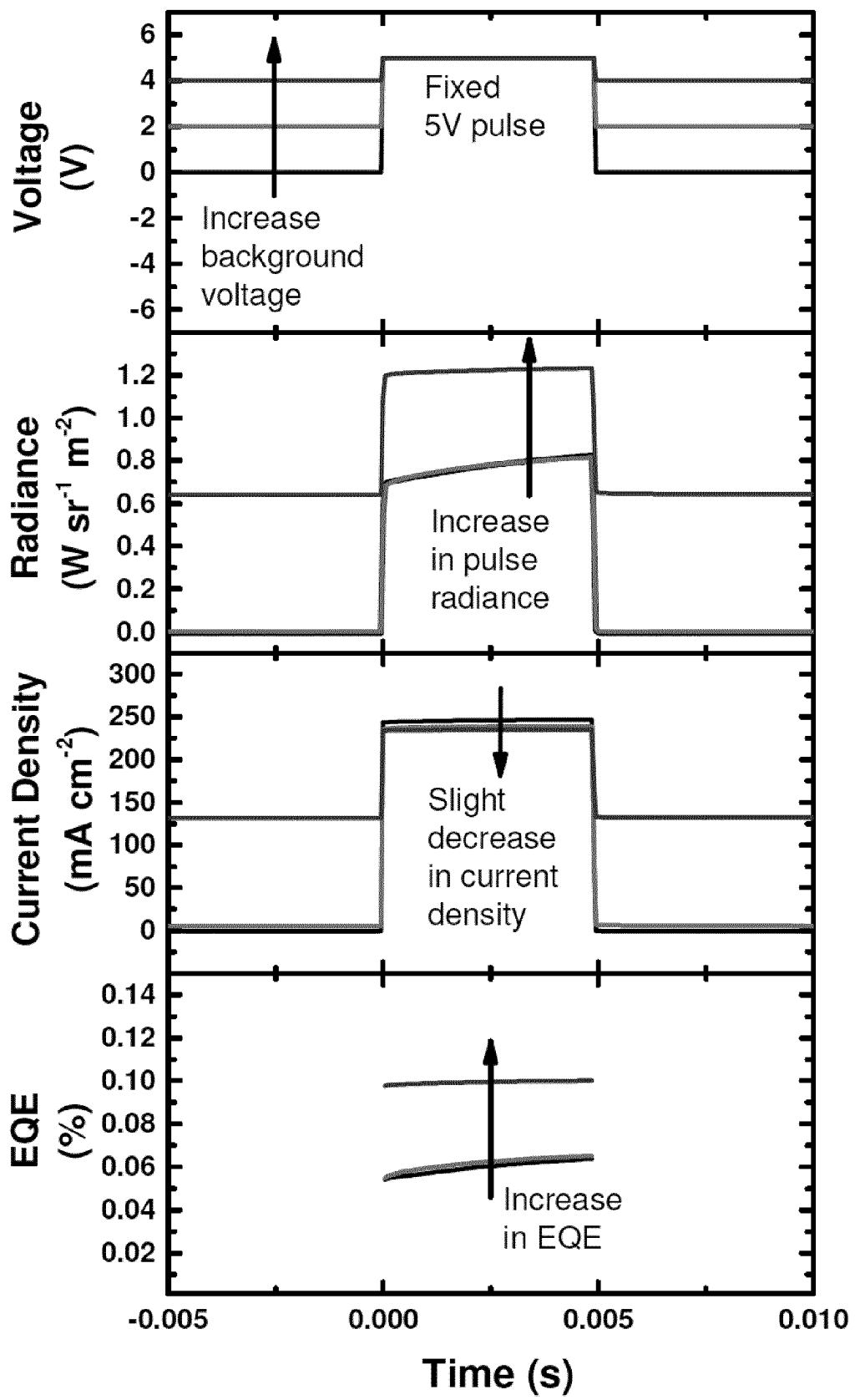
FIGS. 9a and 9b show changes in radiance, current density, and EQE when applying a fixed +5 V square voltage pulse with a width of 5 ms and a frequency of 20 Hz to a $CH_3NH_3PbI_{3-x}Cl_x$ PeLED, when respectively, the background voltage was varied from (a) 0 to +4 V and from (b) 0 to −6 V.
Figure 9B:
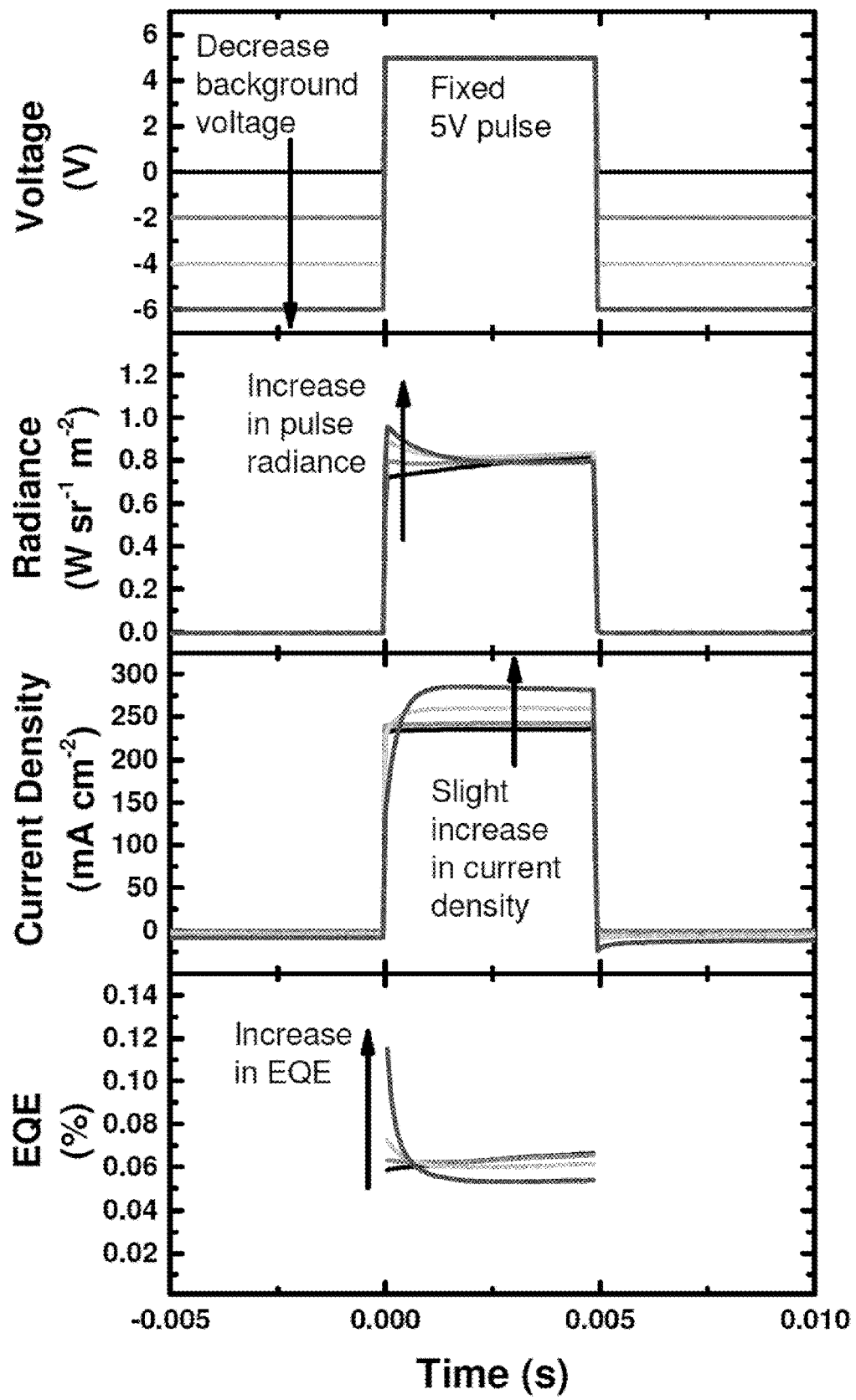

FIGS. 9a and 9b demonstrate that this increase in light-emitting efficiency is related to the history of electric field polarization across the device. In the experiments, a device which is pre-polarized with an external bias emits at a higher radiance and efficiency. Over the duration of the voltage pulse, the perovskite device becomes increasingly polarized, hence giving higher electroluminescence with longer pulse durations.

Specifically, the data shown in FIGS. 9a and 9b was obtained from an experiment in which a fixed +5 V square voltage pulse with a width of 5 ms and a frequency of 20 Hz was applied to the CH$_3$NH$_3$PbI$_{3-x}$Cl$_x$ PeLED. The background voltage was varied from (a) 0 to +4 V and from (b) 0 to −6 V, and the resulting changes in radiance, current density and EQE were monitored over the duration of the pulse. The profiles of the applied voltage are presented in the top-most graph in each Figure.

When the background voltage was increased from 0 to +4 V, an increase in radiance and EQE and a slight decrease in current density were observed over the 5 ms pulse. When the background voltage was decreased into the reverse bias from 0 to −6 V, the radiance and EQE were measured to be higher at the start of the pulse, and gradually decreased over the duration of the pulse. The pulse current density was slightly higher when the background voltage was at reverse bias.

From these results, it is clear that the perovskite device emits more strongly when pre-polarized with an electrical bias. The application of both forward and reverse bias in the background triggers an increase in light emission during the fixed +5 V pulse. When the background voltage is 0 V, the radiance increases over the duration of the pulse as a result of increasing polarization over time. At +4 V background, the perovskite is already pre-polarized, hence yielding a higher emission from the beginning of the pulse. At a negative background voltage, the perovskite starts off being polarized and is hence more emissive, but the emission gradually decays as the positive pulse voltage removes the polarization and eventually causes a reversal in the polarization direction.

It is believed that the polarization at such slow timescale is a result of ionic trap (or defect) migration across the active layer; a pre-polarization voltage may drive the ionic traps out of the bulk emissive layer, therefore suppressing non-radiative trap-mediated recombination and enhancing the radiative bimolecular recombination. This model is also consistent with the observed changes in current density due to device polarization. The ionic traps migrate in a direction that partially screens the applied background voltage. Hence, at a positive background bias, the screening causes the internal field during the +5 V pulse to be slightly diminished, giving a smaller current density. At a negative background bias, the field is enhanced during the +5 V pulse, giving a higher current density.

Figure 10:
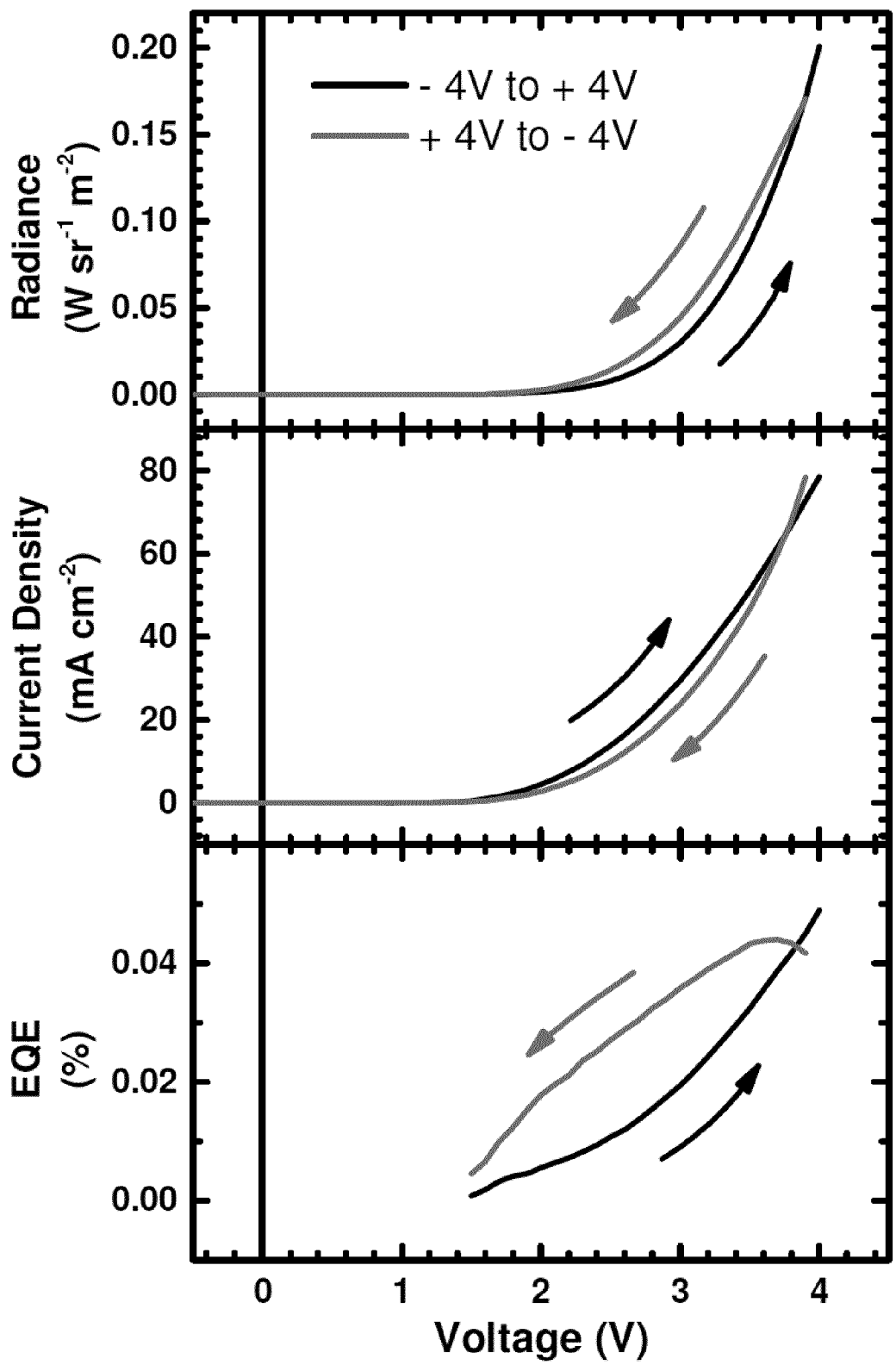
FIG. 10 shows hysteresis effects in radiance, current density and external quantum efficiency during current-voltage measurements.

This polarization effect is also reflected in the hysteretic current-voltage characteristics of the PeLED, as shown in FIG. 10. When the device is swept from −4 V (reverse bias) to +4 V (forward bias), the radiance and EQE are lower but the current density is higher, as compared to a voltage sweep from +4 V to −4 V. This is due to the polarization history of the device during the voltage sweep where a history of higher polarization (i.e. +4 V decreasing to −4 V) leads to higher radiance and EQE and a smaller current density, consistent with observations in the pulse experiments. It is postulated that a high polarization voltage drives the ionic traps out of the bulk emissive layer, therefore suppressing non-radiative trap-mediated recombination and enhancing the radiative bimolecular recombination.

In the experiments, an increase in EL quantum efficiency was observed with both increasing voltage and increasing current density (see FIGS. 7a and 7c). In order to investigate the relation of radiative recombination with respect to charge (or excitation) density, photoluminescence quantum efficiency (PLQE) as a function of laser excitation flux was measured (see FIG. 7c). A thin film structure of TiO$_2$/CH$_3$NH$_3$PbI$_{3-x}$Cl$_x$/F8 that is identical to the earlier devices for measurement was fabricated. The PLQE rises with laser photon flux in a trend that is similar to the rise of device quantum efficiency with current density, confirming that high charge densities are essential for efficient radiative recombination. In FIG. 7c, IQE vs. current density was compared in the same plot as PLQE vs. absorbed photon flux and a good agreement was found between the quantum efficiencies obtained via laser excitation and electrical injection. The extrapolation of the IQE suggests that higher electroluminescence quantum efficiency may be achievable at higher current densities. It is notable that the quantum efficiency of the pulsed device also exhibits the same linear increase with current density, although efficiencies are lower compared to the steady state measurements due to the relatively short 1 ms pulse width used (see FIG. 8). The lower device EL quantum efficiencies compared to PLQE suggest non-radiative losses by electrical injection, which may be reduced by the optimization of device fabrication process if these losses are predominantly due to high leakage currents.

The applicants have previously demonstrated that radiative recombination in $CH_3NH_3PbI_{3-x}Cl_x$ perovskites is bimolecular in nature (F. Deschler et al, *The Journal of Physical Chemistry Letters* 2014). The need for high excitation densities for efficient radiative recombination suggests the presence of a competing non-radiative pathway. Since bimolecular recombination kinetics follow an $n^2$ relationship (where n=excitation density), a radiative bimolecular pathway can dominate at higher charge densities. With the fluxes produced in the devices of the present invention, charge densities are relatively low and the competing non-radiative channels dominate, giving rise to a modest EL quantum efficiency.

Figure 11:
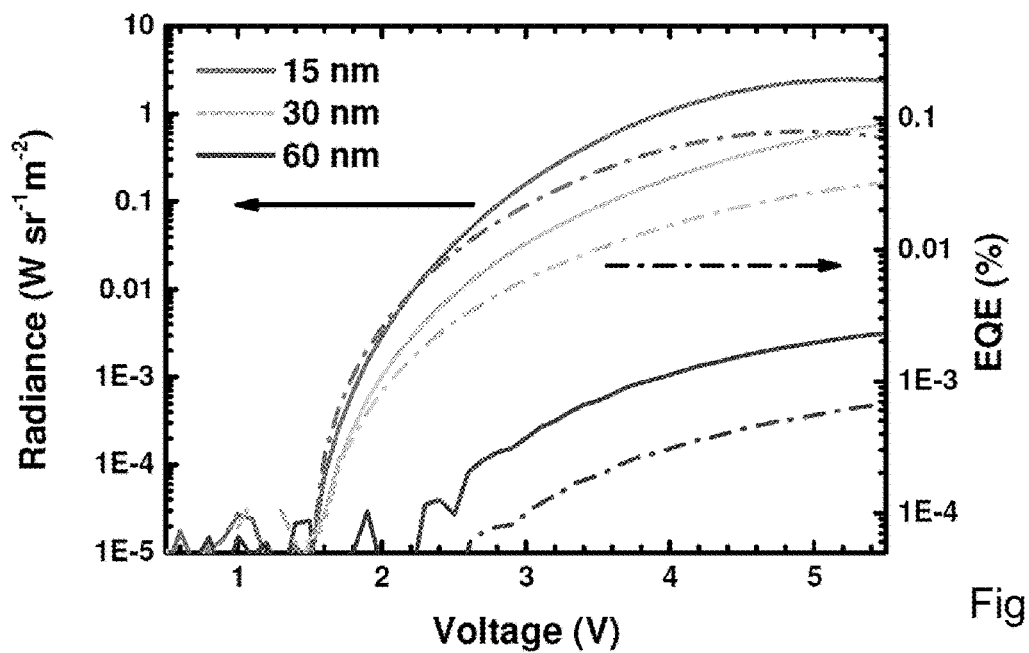
FIG. 11 depicts a graph showing combined plots of radiance vs. voltage (solid lines) and EQE vs. voltage (dash lines) of $CH_3NH_3PbI_{3-x}Cl_x$ PeLED devices with different perovskite layer thicknesses.

It is interesting to note that a high PLQE of 10% can be achieved in a $TiO_2/CH_3NH_3PbI_{3-x}Cl_x/F8$ film structure. This is compared to a PLQE of 26% for a pristine perovskite film of equivalent thickness (15 nm) at an equivalent laser excitation flux. This appears to confirm the formation of a charge confining well structure in the devices of the present invention, where excitations are minimally quenched at the two heterojunctions, despite an emissive layer thickness of only 15 nm. To further demonstrate the effectiveness of our thin well structure, devices using thicker perovskite films were fabricated (see FIG. 11). The radiance and quantum efficiency of the devices decrease markedly at larger perovskite thicknesses, demonstrating the need for spatial confinement of charges to ensure a high rate of electron-hole capture and radiative recombination. In addition, reabsorption losses are likely to be lower in the thinner films. It should be noted that these perovskite films are annealed for a longer time (30 min) to ensure the complete formation of perovskites for the thicker layers.

Figure 12:
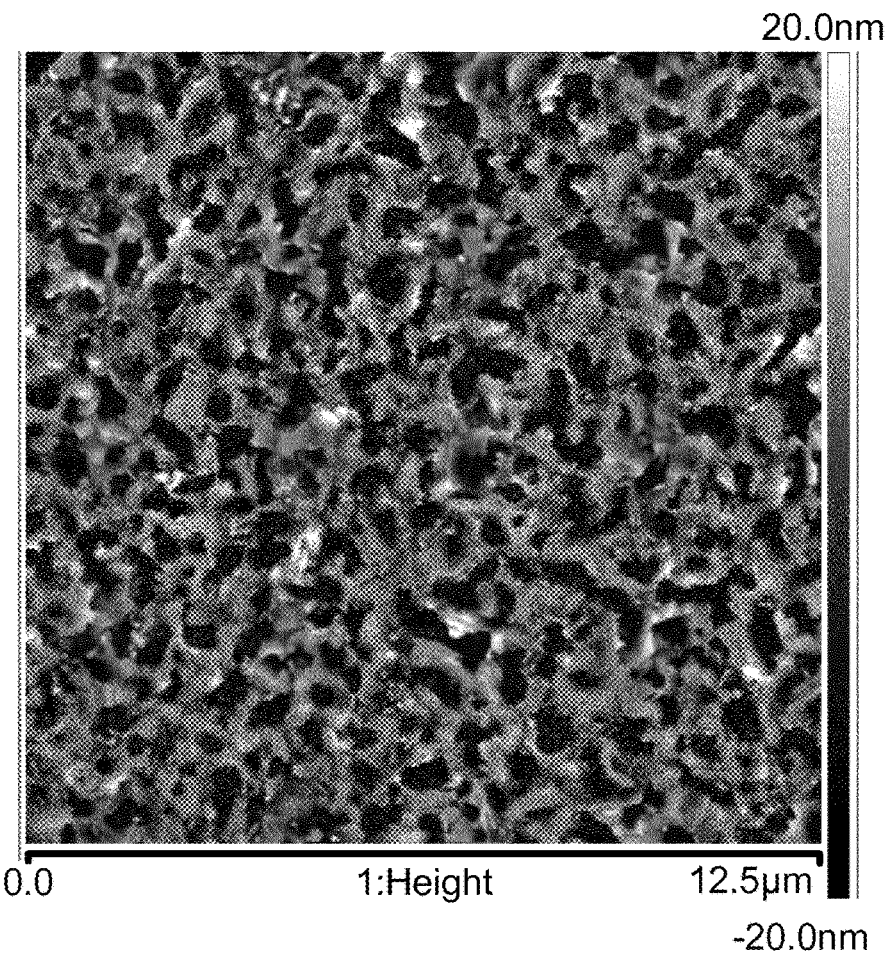
FIG. 12 shows an Atomic Force Microscopy (AFM) image of a $CH_3NH_3PbI_{3-x}Cl_x$ perovskite thin film.

These findings so far suggest that higher charge densities, higher polarization and thinner emission layers are possible routes towards enhancing the electroluminescence efficiency. FIG. 12 shows an Atomic Force Microscopy (AFM) image of the $CH_3NH_3PbI_{3-x}Cl_x$ perovskite thin film, showing incomplete film coverage over a $TiO_2$ coated substrate. The AFM image shows that the surface coverage of the $CH_3NH_3PbI_{3-x}Cl_x$ perovskite is incomplete (~30% voids) in such thin layers, causing possible contact between the $TiO_2$ and F8 layers.

Figure 13:
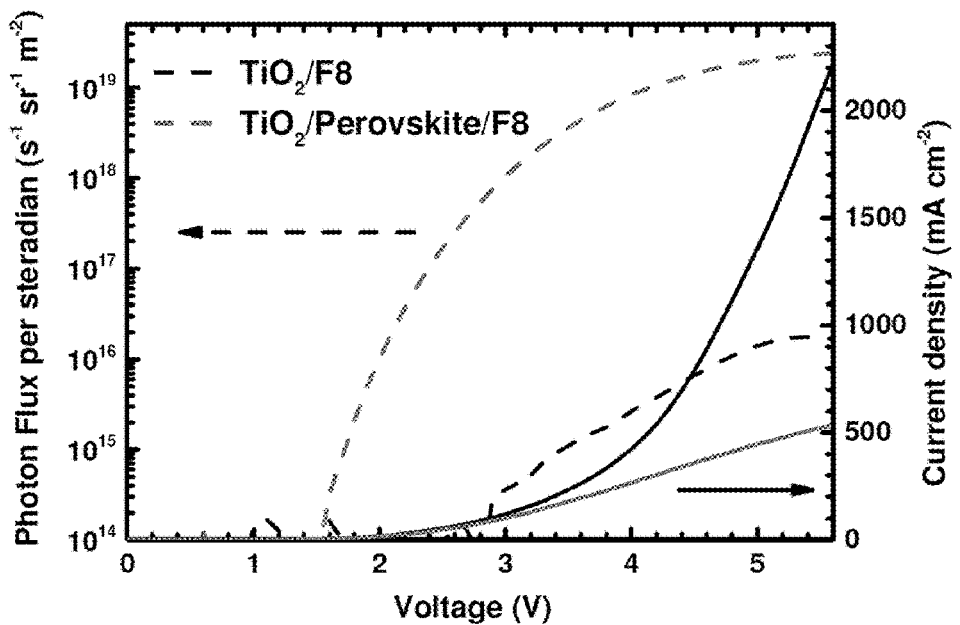
FIG. 13 shows a graph of combined photon flux per steradian, and current density vs. voltage characteristics of $TiO_2/F8$ and $TiO_2/CH_3NH_3PbI_{3-x}Cl_x/F8$ devices.

In order to investigate the effects of electrical shunts at $TiO_2$/F8 interfaces, a $TiO_2$/F8 device was fabricated without the thin perovskite interlayer. FIG. 13 shows a graph of combined photon flux per steradian (dash lines) and current density (solid lines) vs. voltage characteristics of $TiO_2$/F8 and $TiO_2/CH_3NH_3PbI_{3-x}Cl_x/F8$ devices. As shown, $TiO_2$/F8 device gives higher current density compared to the perovskite device. Electroluminescence in $TiO_2$/F8 device is negligible. The current density of the $TiO_2$/F8 device was found to be several times higher than the perovskite device at forward bias, indicating that there are possible current losses at the $TiO_2$/F8 interface that do not contribute to electroluminescence. Optimization of thin film formation and morphology towards complete perovskite coverage is therefore expected to enhance device radiance and quantum efficiency. It is further noted that the EL photon flux from the F8-only device is 3 orders of magnitude lower than the perovskite device, confirming that the F8 layer does not participate in light emission but serves only as a hole transport and electron blocking layer.

Figure 16A:
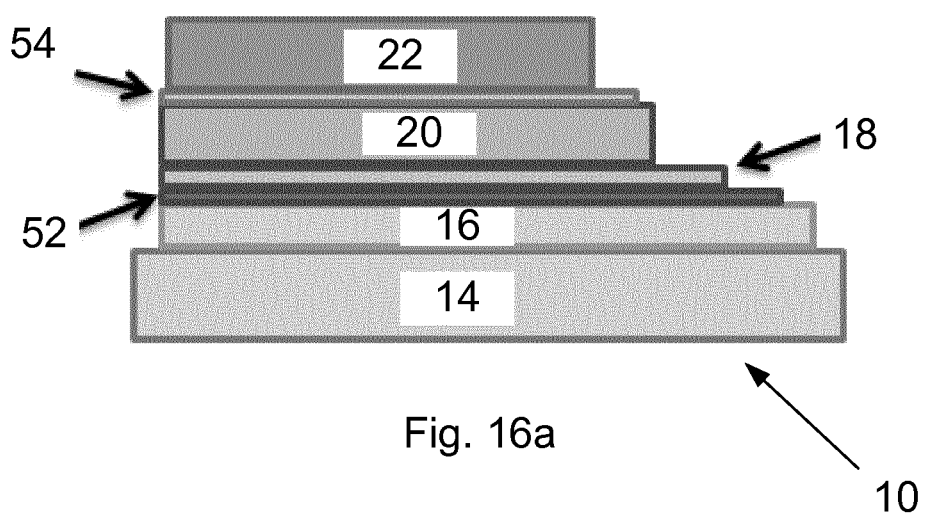
FIG. 16a shows a variation of the device of FIG. 1a comprising an aluminium oxide layer.

To investigate whether the efficiency of the PeLED of FIG. 1a could be improved, a device comprising a metal oxide interlayer was fabricated. As shown in FIG. 16a, device 10 may further comprise a thin insulating layer of metal oxide 52 provided between the first charge injecting layer 16 and the active perovskite layer 18. Without wishing to be bound by theory, it is believed that the thin insulating layer 52 (in this case $Al_2O_3$) functions to improve the quality of perovskite film formation and to modify the work function of the charge injecting layer for favourable electron injection. The insulating layer may also suppress luminescence quenching of the perovskite near the charge injection layer. The thin insulating layer 52 may be formed of aluminium oxide, silicon dioxide, zinc oxide, nickel oxide or silicon nitride. Furthermore, a layer of a hole-injecting agent 54 may be provided between the second charge injecting layer 20 and the second electrode 22 (and/or between the active perovskite layer 18 and the first charge injecting layer 16). The hole-injecting agent 54 is typically a thin layer (e.g. <30 nm thick) of a material selected from molybdenum trioxide and tungsten trioxide, and may act to increase the hole injection efficiency into the active perovskite layer 16. Thus, FIG. 16a shows a device with an $ITO/TiO_2/Al_2O_3/CH_3NH_3PbI_{3-x}Cl_x/F8/MoO_3/Ag$ structure.

Figure 16B:
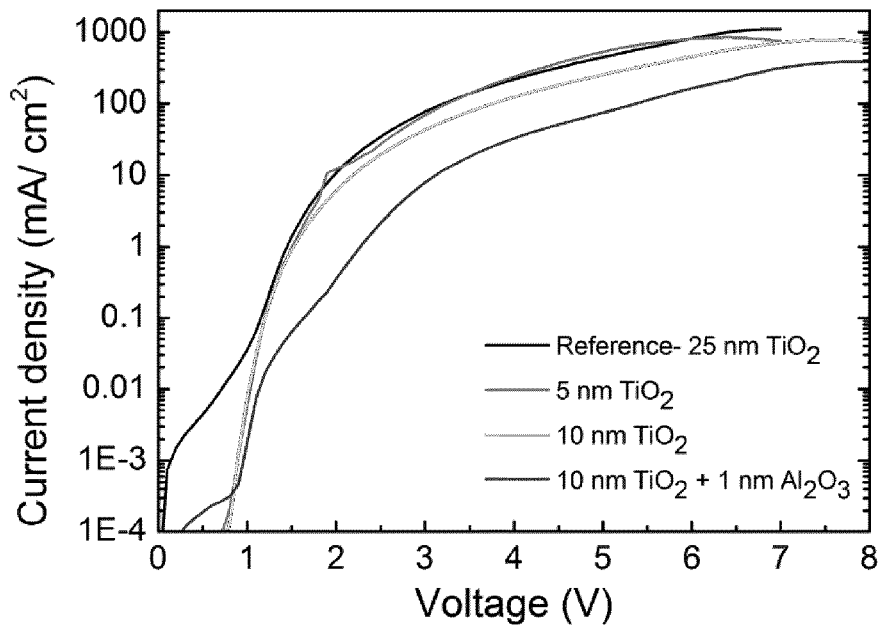
FIGS. 16b and 16c show, respectively, the current density and radiance versus applied bias voltage for devices with an ITO/$TiO_2$/$Al_2O_3$/$CH_3NH_3PbI_{3-x}Cl_x$/F8/$MoO_3$/Ag structures.
Figure 16C:
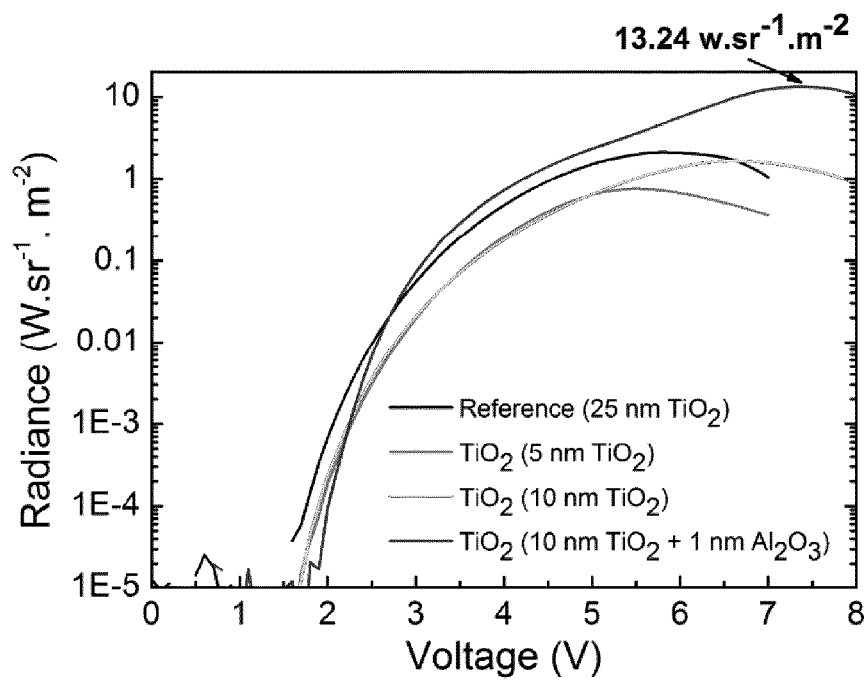

To demonstrate the effect of a thin insulating layer of metal oxide on electroluminescence, devices were fabricated using different thickness of the first charge injecting layer 16 (which in this case comprises titanium oxide), and a device was fabricated with an additional metal oxide layer, i.e. thin insulating layer 52, deposited over the first charge injecting layer 16. In this case, the thin insulating layer 52 comprises aluminum oxide ($Al_2O_3$). FIGS. 16b and 16c show, respectively, the current density and radiance versus applied bias voltage for these devices. Each layer may be deposited using the fabrication techniques described in detail below. As shown in FIG. 16c, the brightness of the device comprising the additional $Al_2O_3$ interlayer 52 is higher than those devices comprising the titanium dioxide charge injecting layers of different thicknesses.

Figure 16D:
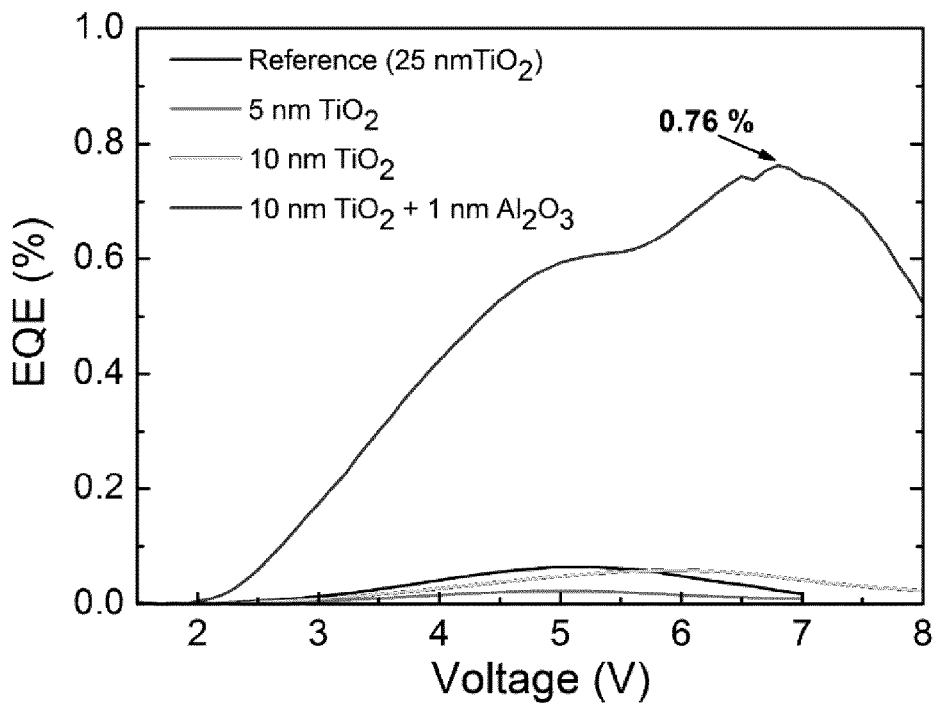
FIGS. 16d and 16e show, respectively, the external and calculated internal quantum efficiency versus applied bias voltage for devices comprising a metal oxide layer.
Figure 16E:
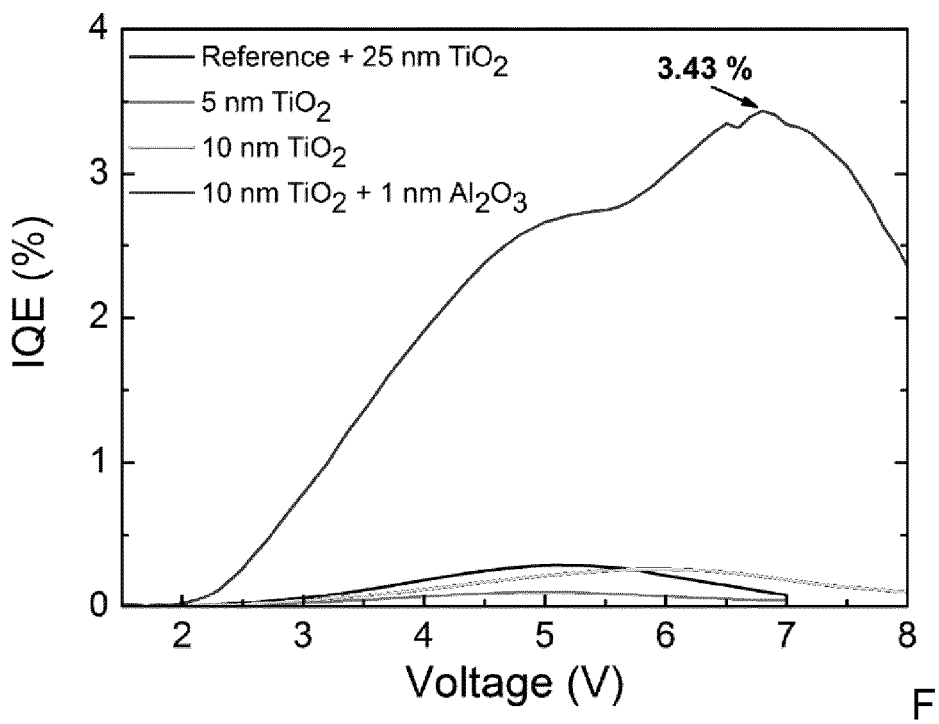

FIGS. 16d and 16e show, respectively, the external and calculated internal quantum efficiency versus applied bias voltage for a device comprising a thin insulating layer of metal oxide compared to devices with varying thicknesses of titanium dioxide (and no additional thin insulating layer). As shown, the EQE (0.76%) of the device comprising the additional $Al_2O_3$ interlayer 52 rises with increasing voltage, while the internal quantum efficiency (IQE) is 3.43%. Compared with the EQE and IQE of a device without the additional thin insulating layer (see FIG. 7a and corresponding description above), this indicates that the additional thin insulating layer is required for efficient radiative recombination.

Figure 16F:
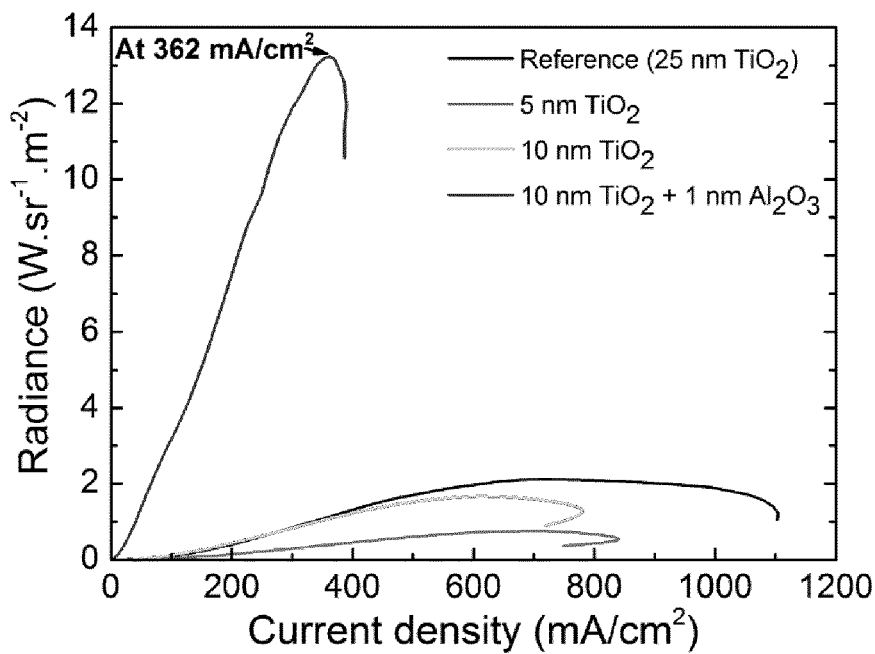
FIGS. 16f and 16g show, respectively, the radiance and calculated internal quantum efficiency versus current density for a device comprising a metal oxide layer.
Figure 16G:
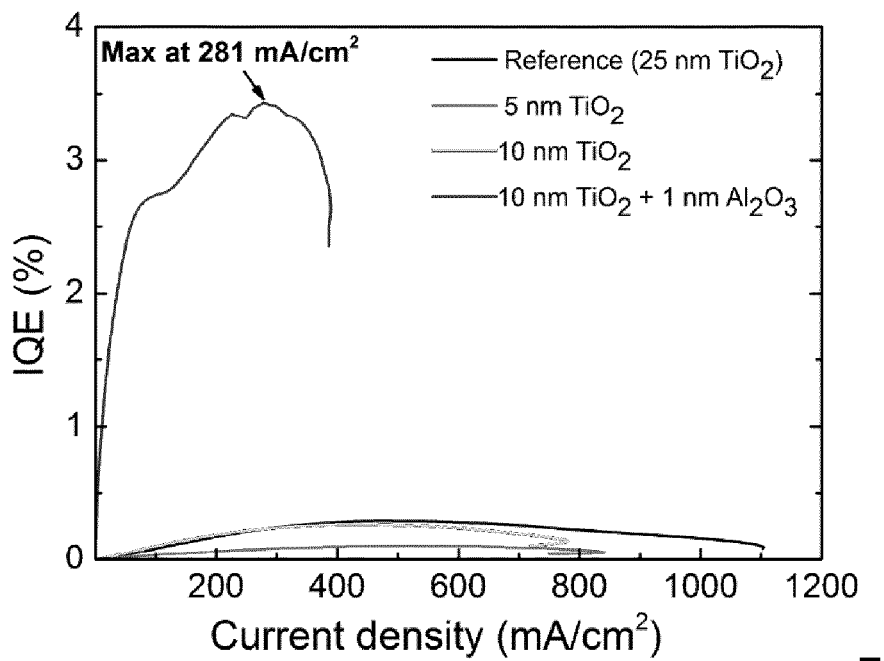
Figure 16H:
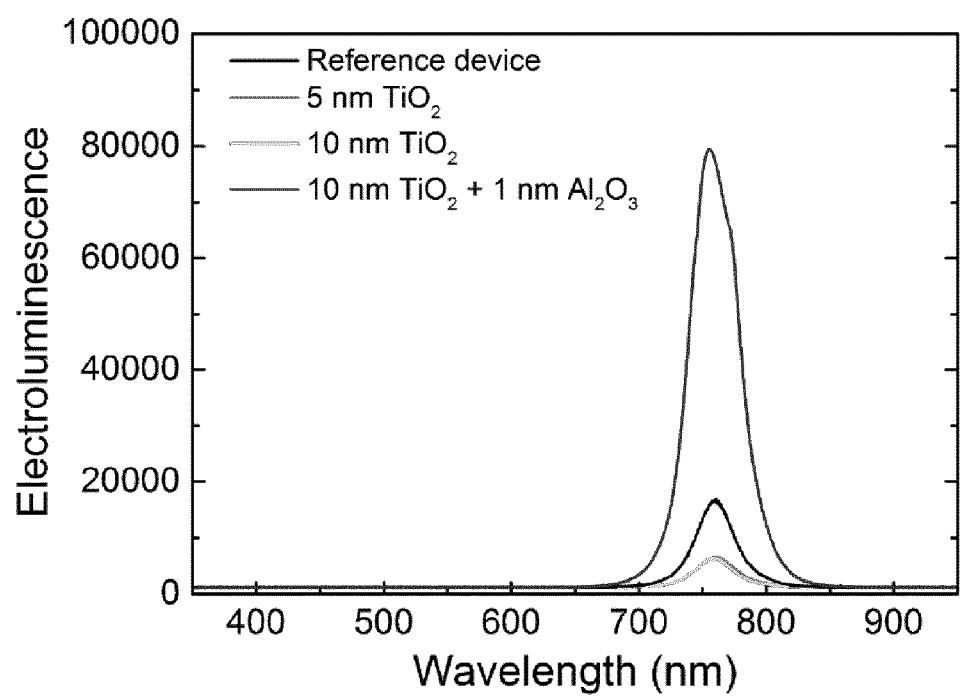
FIG. 16h shows electroluminescence versus wavelength for a device comprising a metal oxide layer.

FIGS. 16f and 16g show, respectively, the radiance and calculated internal quantum efficiency versus current density for a device comprising a metal oxide thin insulating layer compared to devices with varying thicknesses of titanium dioxide (and no additional thin insulating layer). The device comprising the $Al_2O_3$ thin insulating layer exhibits a much higher radiance at a current density of 363 mA cm$^{-2}$ than the devices comprising no additional $Al_2O_3$ thin insulating layer (which also show a decline in radiance beyond around 600 mA cm$^{-2}$). Device degradation and efficiency drop-off may be driven by heating at high current densities. However, it is clear from FIG. 16h, which shows electroluminescence versus wavelength for these devices, that a markedly higher electroluminescence may be achievable by devices including the thin insulating layer.

In a further example of a device to show the effect of incorporating a thin film of an insulating layer on electroluminescence, a device with the same architecture as FIG. 16 was prepared. A first charge injecting layer 16 (a 25 nm electron injecting zinc oxide layer) was deposited on a glass/ITO substrate 14. A 1 nm thin insulating layer 52 of aluminium oxide was deposited over the first charge injecting layer 16. A $CH_3NH_3PbBr_3$ perovskite layer 18 was deposited on the thin insulating layer 52. A hole injecting layer 20 comprising F8 was deposited on the perovskite layer 18 followed by a thin layer of molybdenum trioxide 54 of less than 20 nm. Finally, a silver electrode 22 was deposited on the molybdenum trioxide layer 54. Two devices were prepared in this manner, one in which the perovskite layer was annealed for 15 minutes and one where it was annealed for 40 minutes before deposition of the hole injecting layer 20 thereon.

Two further equivalent devices were prepared which were identical except that in place of the 1 nm aluminium oxide on the zinc oxide electron injecting layer 16, the two devices contained a 1 nm aluminium oxide on a titanium oxide electron injecting layer 16.

Figure 17A:
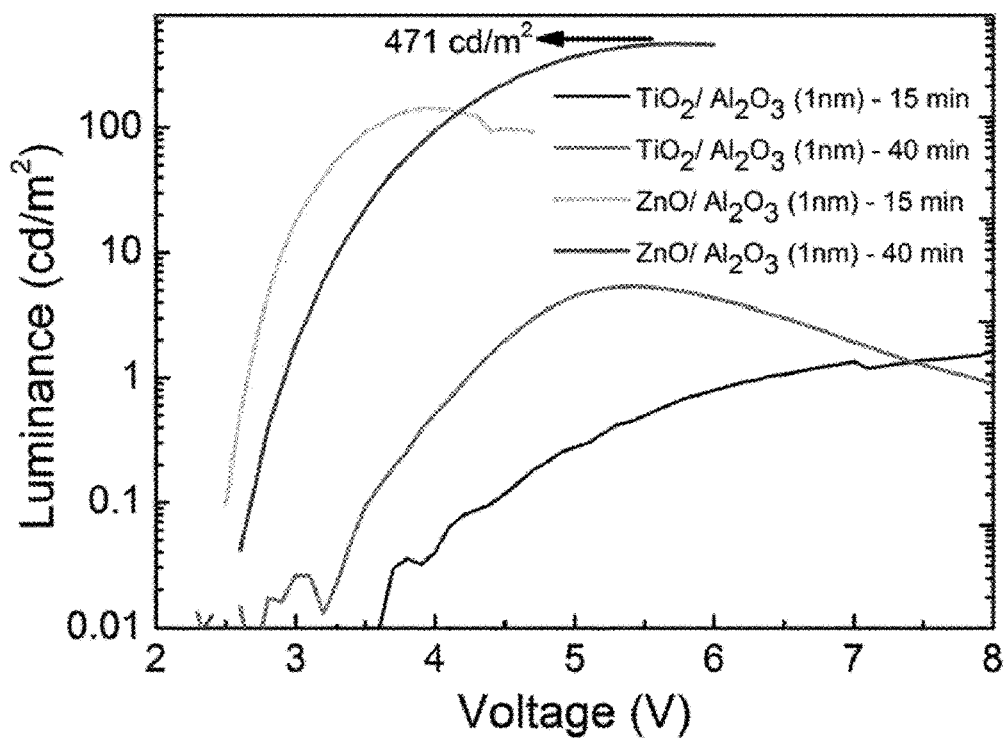
FIG. 17a is a plot of luminance versus voltage characteristics for ITO/ZnO & $TiO_2/Al_2O_3$/perovskite ($CH_3NH_3PbBr_3$)/F8/$MoO_3$/Ag devices.

FIG. 17a is a plot of luminance versus voltage characteristics for the ITO/ZnO & $TiO_2/Al_2O_3$/perovskite/F8/$MoO_3$/Ag devices. It can be seen that as for the device described above, the inclusion of the thin insulating layer of aluminium oxide appears to function to improve the quality of perovskite film formation and to modify the work function of the charge injecting layer for favourable electron injection. The insulating layer may also suppress luminescence quenching of the perovskite near the charge injection layer.

Figure 17B:
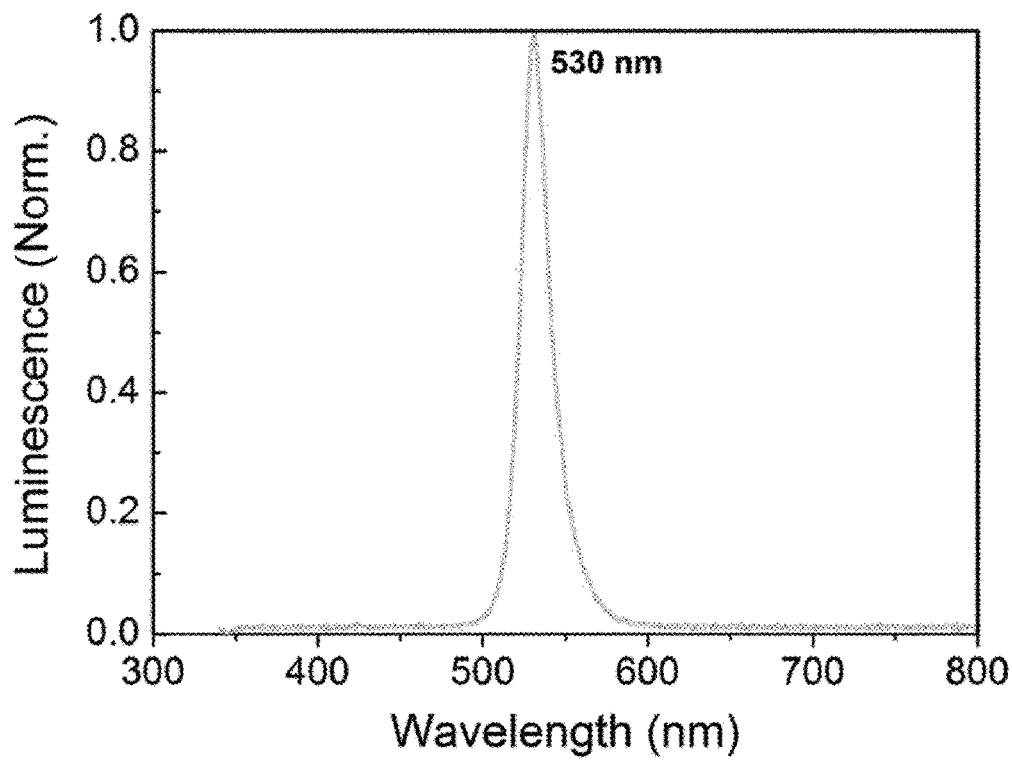
FIG. 17b is a plot of electroluminescence versus wavelength for a ITO/ZnO/$Al_2O_3$/perovskite ($CH_3NH_3PbBr_3$)/F8/$MoO_3$/Ag device.

As shown in FIG. 17b, the device ITO/ZnO/$Al_2O_3$/perovskite/F8/$MoO_3$/Ag device in which the perovskite layer was annealed for 40 minutes, achieves electroluminescence at around 530 nm. The electroluminescence peak is a sharp, strong peak.

Example Structure 2

In order to demonstrate the application of organometal halide perovskite as visible light emitters, the larger bandgap $CH_3NH_3PbBr_3$ perovskite material was used as a green emitter in a PeLED device of the present invention. Since a larger bandgap makes it more difficult to achieve electron injection from $TiO_2$ into the perovskite conduction band, an inverted device structure (relative to that shown in FIG. 1a) was used.

Figure 2A:
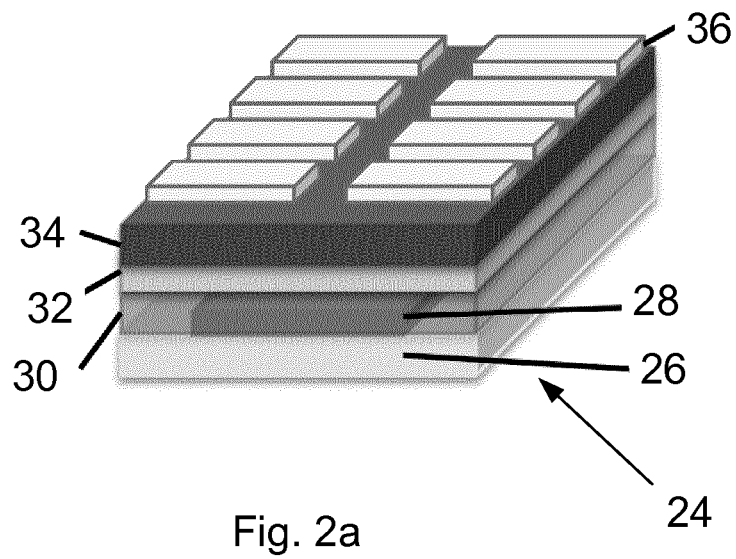
FIG. 2a shows a device architecture comprising $CH_3NH_3PbBr_3$ perovskite, according to a further embodiment of the invention.

FIG. 2a shows an example of an inverted device architecture 24. Here, the PeLED is fabricated on a transparent substrate 26, which may be a glass substrate. Generally speaking, the PeLED illustrated here comprises a first electrode 28 coupled to a first charge injecting layer 30, a second electrode 36 coupled to a second charge injecting layer 34, and an active layer 32 formed of an organometal halide perovskite material. The active layer 32 is sandwiched between the first and second charge injecting layers 30, 34. One or both of the charge injecting layers 30, 34 may be formed of a semiconductor material.

Preferably, the first electrode 28 may be formed of a transparent, conductive material, such as indium tin oxide (ITO). One or both of the first and second charge injecting layers 30, 34 may actively inject charge into the active perovskite layer 32, or one or both of layers 30, 34 may simply act as a charge transport and charge blocking layer.

The second electrode 36 may be formed of any conductive material such as, but not limited to $MoO_3$/Ag, Ca/Ag, Au etc.

For illustrative purposes, the visible light emitting PeLED device 24 is fabricated using an ITO/PEDOT:PSS/$CH_3NH_3PbBr_3$/F8/Ca/Ag architecture. Thus, here, the first charge injecting layer 30 is formed from a conductive polymer material, PEDOT:PSS, and the second charge injecting layer 34 is formed from F8. In this structure, the injected charges are confined within the active layer 32 by providing the charge injecting layers 30, 34 from a material that has a large bandgap relative to the bandgap of the perovskite layer. Additionally, confinement of the injected charges (holes and electrons) within the active (emissive) perovskite layer may be improved further by forming the PeLED with a thin active perovskite layer, e.g. having a thickness of less than 100 nm (or <60 nm, or even <20 nm).

Here, ITO is the anode (electrode 28) and is coupled to the first charge injecting layer 30, which may be formed from PEDOT:PSS and is used to inject holes into the active perovskite layer 32. The second electrode 36 is the cathode and may be formed from silver/calcium. The second electrode 36 is coupled to the second charge injecting layer 34, which may be formed from a poly(9,9'-dioctylfluorene) (F8) polymer semiconductor material. The F8 material serves as a spacer layer for electron transport and to prevent emission quenching near the interface with the second electrode 36 (rather than actively injecting charge into the perovskite layer). Thus, the width of the spacer layer may be chosen such that electrons are injected into the active perovskite layer 32, and in the example described here, the F8 layer has a thickness of 50 nm. In order to spatially confine injected charges for efficient radiative recombination, the active perovskite layer 32 (formed from $CH_3NH_3PbBr_3$) was deposited as a film of thickness 20 nm.

Figure 14:
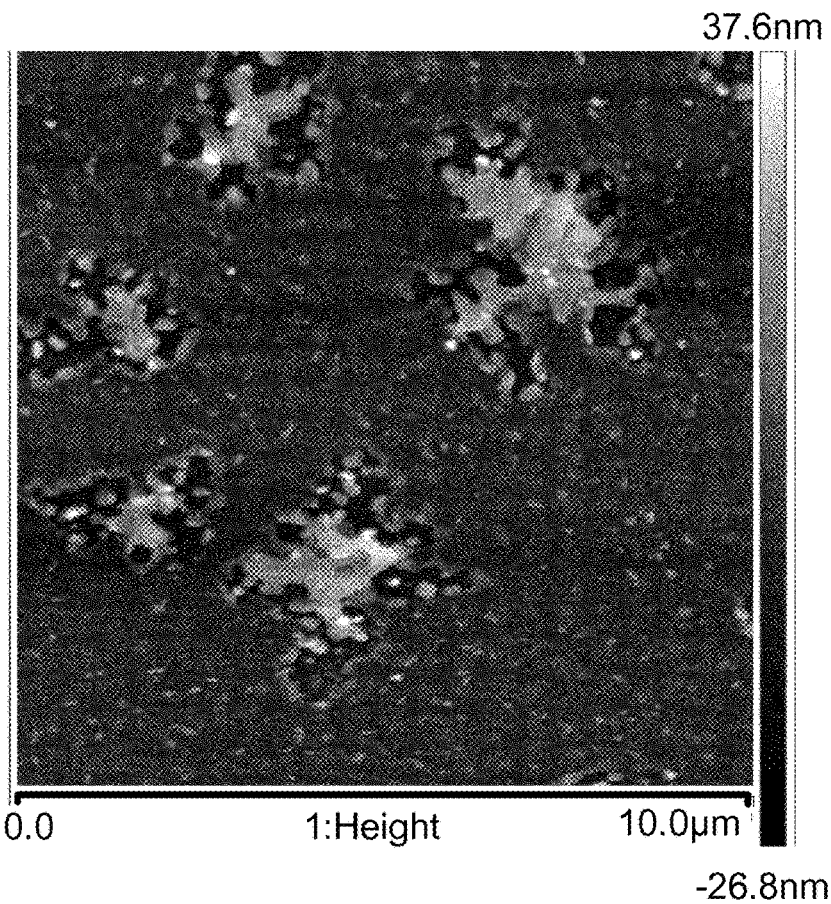
FIG. 14 shows an AFM image of the $CH_3NH_3PbBr_3$ perovskite thin film.

FIG. 14 shows the film morphology of the perovskite thin film. The AFM image of the $CH_3NH_3PbBr_3$ perovskite thin film shows incomplete film coverage over a PEDOT:PSS coated substrate, and specifically shows an extended perovskite film with crystal clusters which are surrounded by voids.

To fabricate the structure shown in FIG. 2a, ITO coated glass electrodes 28 were cleaned successively with acetone and isopropanol, followed by 10 minutes oxygen plasma treatment. PEDOT:PSS (Clevios P VP AI 4083) was spin coated onto the substrate at 6000 rpm for 30 seconds, and annealed at 140° C. for 30 minutes in a nitrogen atmosphere. The $CH_3NH_3PbBr_3$ perovskite precursor solution was spin coated onto PEDOT:PSS at 3000 rpm for 30 seconds and annealed at 100° C. for 15 minutes to give a perovskite film thickness of ~20 nm. A solution of F8 in chlorobenzene (10 mg/mL) was spin coated onto the perovskite layer at 3000 rpm for 30 seconds to give a 50 nm film. Ca (20 nm) and Ag (100 nm) were successively deposited by vacuum thermal evaporation. The device thus obtained was tested without encapsulation.

Figure 2B:
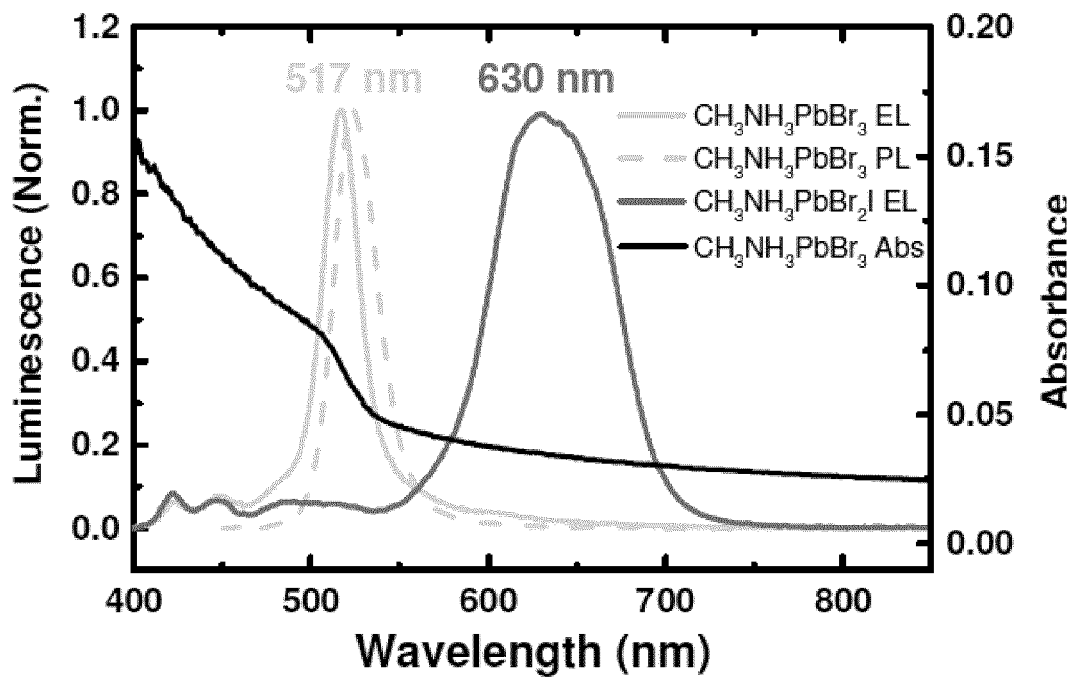
FIG. 2b depicts electroluminescence, photoluminescence and absorbance spectra of $CH_3NH_3PbBr_3$ perovskite on a PEDOT:PSS covered substrate.
Figure 2C:
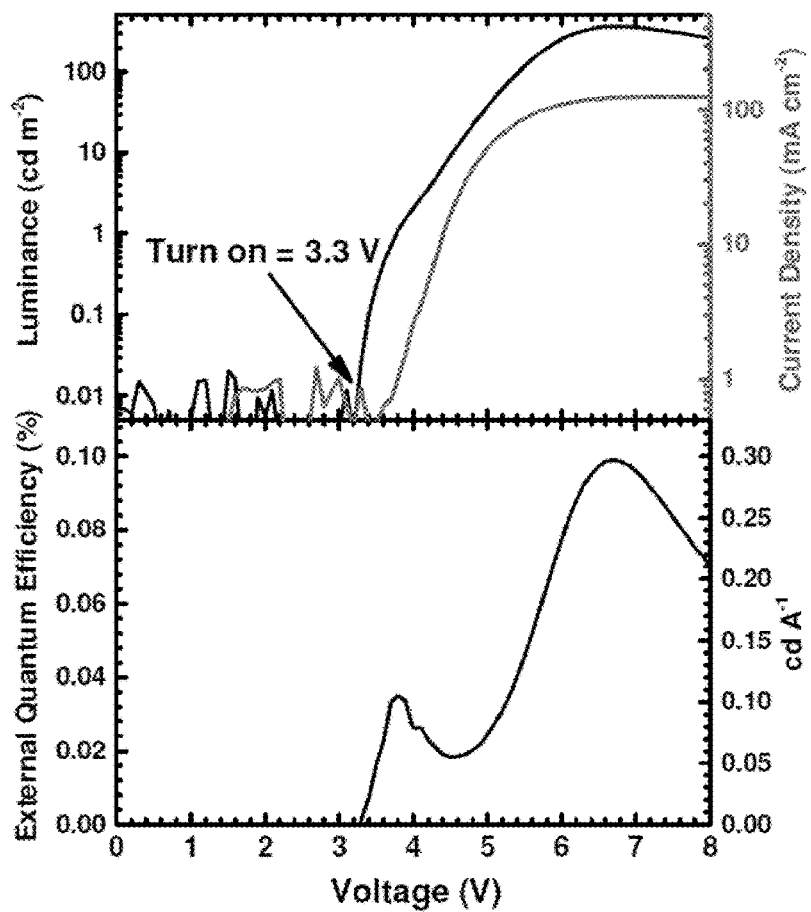
FIG. 2c shows, in the top graph, the combined luminance and current density vs. voltage characteristics of a green PeLED and, in the bottom graph, the external quantum efficiency vs. voltage of green PeLED.
Figure 2D:
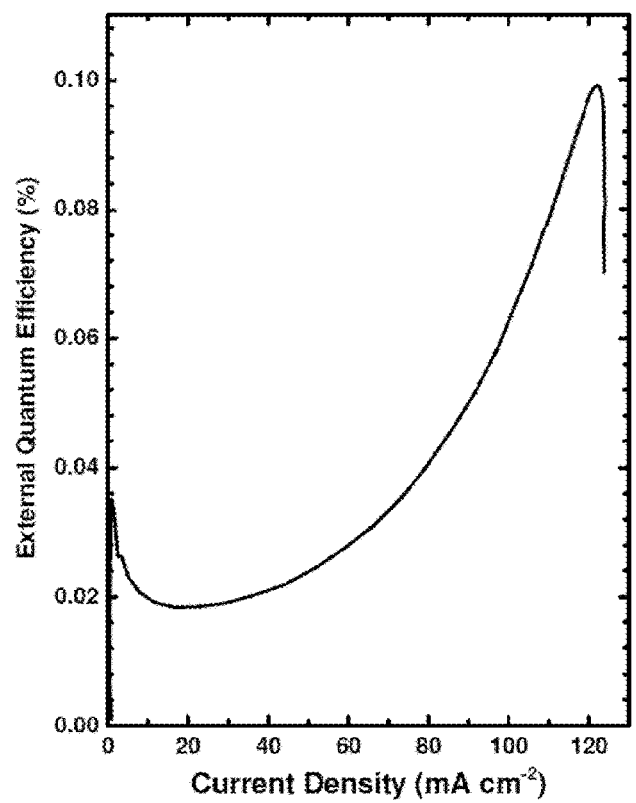
FIG. 2d shows the external quantum efficiency vs. current density of a green PeLED.

As shown in FIG. 2b, bright green electroluminescence was achieved at 517 nm. The $CH_3NH_3PbBr_3$ perovskite PL is slightly red-shifted from the EL, peaking at 524 nm with a PLQE of 7% when excited with a 405 nm blue cw-laser. The device turns on at 3.3 V and reaches a maximum luminance of 364 cd m$^{-2}$ at a current density of 123 mA cm$^{-2}$, as shown in FIG. 2c. This gives an efficiency of 0.3 cd A$^{-1}$, or an EQE of 0.1% and IQE of 0.4% assuming a Lambertian emission profile. Similar to the infrared device, the EL quantum efficiency increases with injection current density (see FIG. 2d), demonstrating a need for high charge densities to achieve efficient radiative recombination.

Figure 15A:
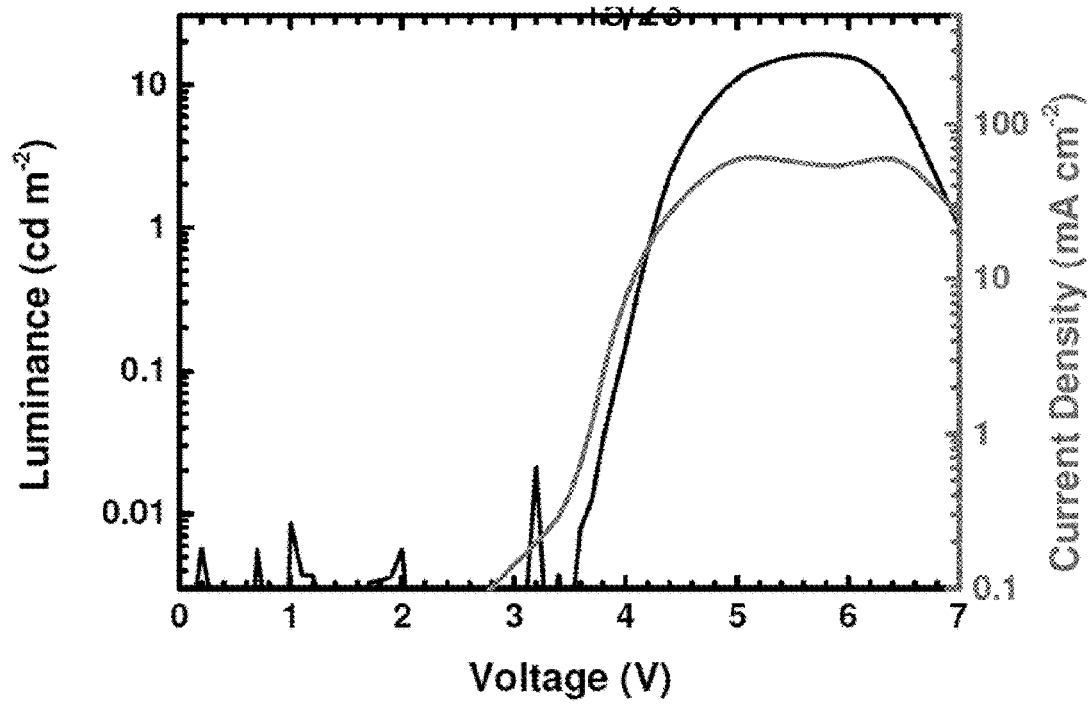
FIG. 15a shows the combined luminance and current density vs. voltage characteristics of ITO/PEDOT:PSS/$CH_3NH_3PbBr_2I/F8/Ca/Ag$ red PeLED.
Figure 15B:
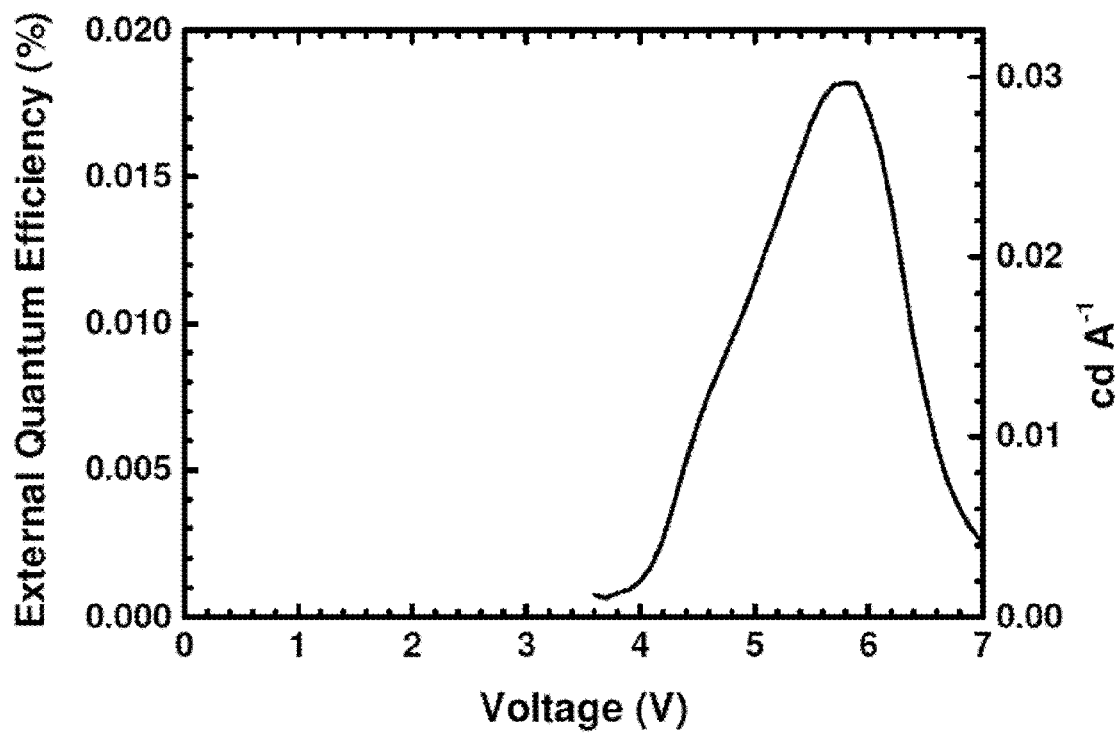
FIG. 15b shows the EQE vs. voltage of a red PeLED.

Red electroluminescence at 630 nm was also demonstrated using a $CH_3NH_3PbBr_2I$ mixed halide perovskite in the same device architecture, showing the versatility and wide bandgap tunability of these organometal halide perovskite materials. FIG. 15a shows the combined luminance and current density vs. voltage characteristics of ITO/PEDOT:PSS/$CH_3NH_3PbBr_2I$/F8/Ca/Ag red PeLED. A maximum luminance of 16.2 cd m$^{-2}$ was achieved at a current density of 55 mA cm$^{-2}$. FIG. 15b shows the EQE vs. voltage of red PeLED. Peak EQE of 0.018% or 0.03 cd A$^{-1}$ was achieved at 5.7 V.

Example Structure 3

Figure 3A:
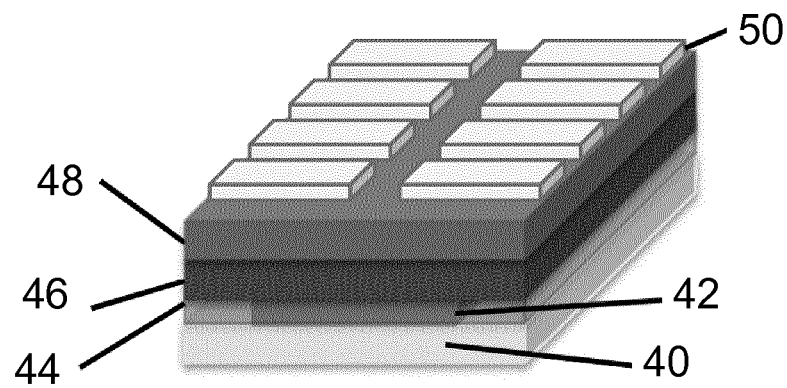
FIG. 3a shows a device architecture comprising a $CH_3NH_3PbI_{3-x}Cl_x$ perovskite layer, according to a further embodiment of the invention.

FIG. 3a shows device architecture 38 according to an embodiment of the invention. The PeLED is fabricated on a transparent substrate 40, which may be a glass substrate. Generally speaking, the PeLED illustrated here comprises a first electrode 42 coupled to a charge injecting layer 44, a second electrode 50, and an active (emissive) layer 48 formed of an organometal halide perovskite material. The active layer 48 is provided between the charge injecting layer 44 and the second electrode 50. In this example device structure, the second electrode 50 directly injects charges into the active perovskite layer 48, and thus can be considered a charge injecting layer. The second electrode 50 may be formed from a conductive material such as Au. The charge injecting layer 44 may be formed from of a semiconductor material, such as titanium dioxide (TiO$_2$) which injects electrons from the first electrode 44 (the anode) into the active perovskite layer. The active perovskite layer may be formed of $CH_3NH_3PbI_{3-x}Cl_x$ material.

Advantageously, the architecture shown here enables the injected charges (holes and electrons) to be confined within the active (emissive) perovskite layer, by forming the PeLED using charge injecting layers 44, 50 from materials that have a large bandgap relative to the bandgap of the perovskite layer. Additionally, confinement of the injected charges (holes and electrons) within the active (emissive) perovskite layer may be improved further by forming the PeLED with a thin active perovskite layer, e.g. having a thickness of less than 100 nm (or <60 nm, or even <20 nm).

Here, ITO is the anode (electrode 42) and is coupled to the first charge injecting layer 44, which may be formed from titanium dioxide or a similar conductive material. The anode 42 generates electrons which pass into the charge injecting layer 44 which injects the electrons into the active perovskite layer 48. The second electrode 50 (i.e. the second charge injecting layer) directly injects holes into the active perovskite layer 48. The second electrode 50 may be formed from Au.

Figure 3B:
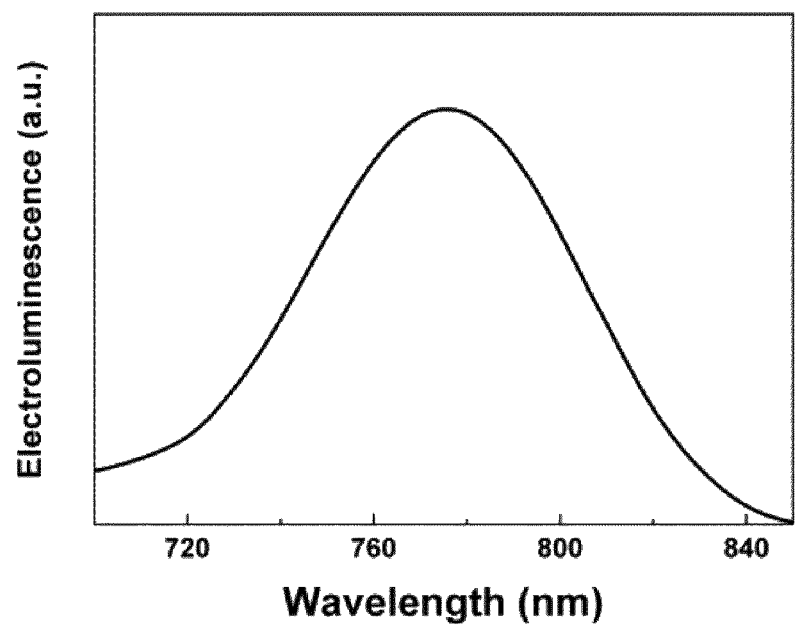

In order to spatially confine injected charges within the active perovskite layer 48 for efficient radiative recombination, a further conductive layer or charge transport layer 46 may be provided between the first charge injecting layer 44 and the perovskite layer 48. The charge transport layer 46 may be formed of a semiconducting material such as poly [2-methoxy-5-(2'-ethylhexyloxy)-1,4-phenylenevinylene (MEH-PPV). Furthermore, a layer of a wetting agent (not shown in FIG. 3a) may be included either between the perovskite layer and the titanium oxide layer or, if present, between the perovskite layer and the charge transport layer 46. This is typically a thin layer (e.g. <30 nm thick) of a material selected from molybdenum trioxide and tungsten trioxide. This can act to increase the charge injection efficiency into the active perovskite layer. As shown in FIG. 3b, the device 38 achieves infrared electroluminescence at around 780 nm.

The device architecture 38 may comprise an ITO/TiO$_2$/MEH-PPV/MoO$_3$/perovskite/Au architecture. The example device comprises an n-type semiconductor 44 coated on to a transparent conducting substrate 42, followed by a semiconducting material 46 such as poly[2-methoxy-5-(2'-ethylhexyloxy)-1,4-phenylenevinylene (MEH-PPV). A thin layer of molybdenum trioxide (MoO$_3$) was deposited onto the semiconducting material MEH-PPV as a surface wetting layer on which, a perovskite ($CH_3NH_3PbI_{3-x}Cl_x$) layer 48 was deposited. A gold (Au) electrode 50 was deposited on top of the perovskite layer for electrical contact.

In more detail, ITO coated glass substrates were cleaned successively with acetone and isopropanol. TiO$_2$ (25 nm) was grown onto the cleaned substrates at 225° C. with atomic layer deposition (ALD), using titanium tetrachloride (TiCl$_4$) and water as precursors. The substrates were transferred into a nitrogen filled glovebox for further fabrication. A solution of MEH-PPV (poly[2-methoxy-5-(2'-ethylhexyloxy)-1,4-phenylenevinylene) in chlorobenzene was spin-coated onto the TiO$_2$ layer. MoO$_3$ (3 nm) was deposited onto MEH-PPV. The $CH_3NH_3PbI_{3-x}Cl_x$ perovskite precursor solution was spin coated onto the MoO$_3$ at 3000 rpm for 60 seconds, and annealed at 100° C. for 45 minutes to give a thin perovskite film. Au (100 nm) was deposited by vacuum thermal evaporation.

Example Structure 4

Using a similar procedure to Example 1, a device with the following architecture was prepared: ITO/ZnO/PEI/perovskite/CBP/MoO$_3$/Au. The example device comprises a zinc oxode (ZnO) electron injecting layer 16 (20 nm) coated on to a transparent ITO-coated glass conducting substrate, followed by a thin layer of the insulating polymer polyethylenimine (PEI) (<5 nm) on which, a perovskite ($CH_3NH_3PbBr_{3-x}Cl_x$) layer 18 (80 nm) was deposited. A layer of the hole injecting material 4,4'-bis(N-carbazolyl)-1,1'-biphenyl (CBP) (40 nm) was deposited onto the perovskite film followed by molybdenum trioxide (15 nm) and finally a gold (Au) (150 nm) electrode was deposited for electrical contact.

Figure 18:
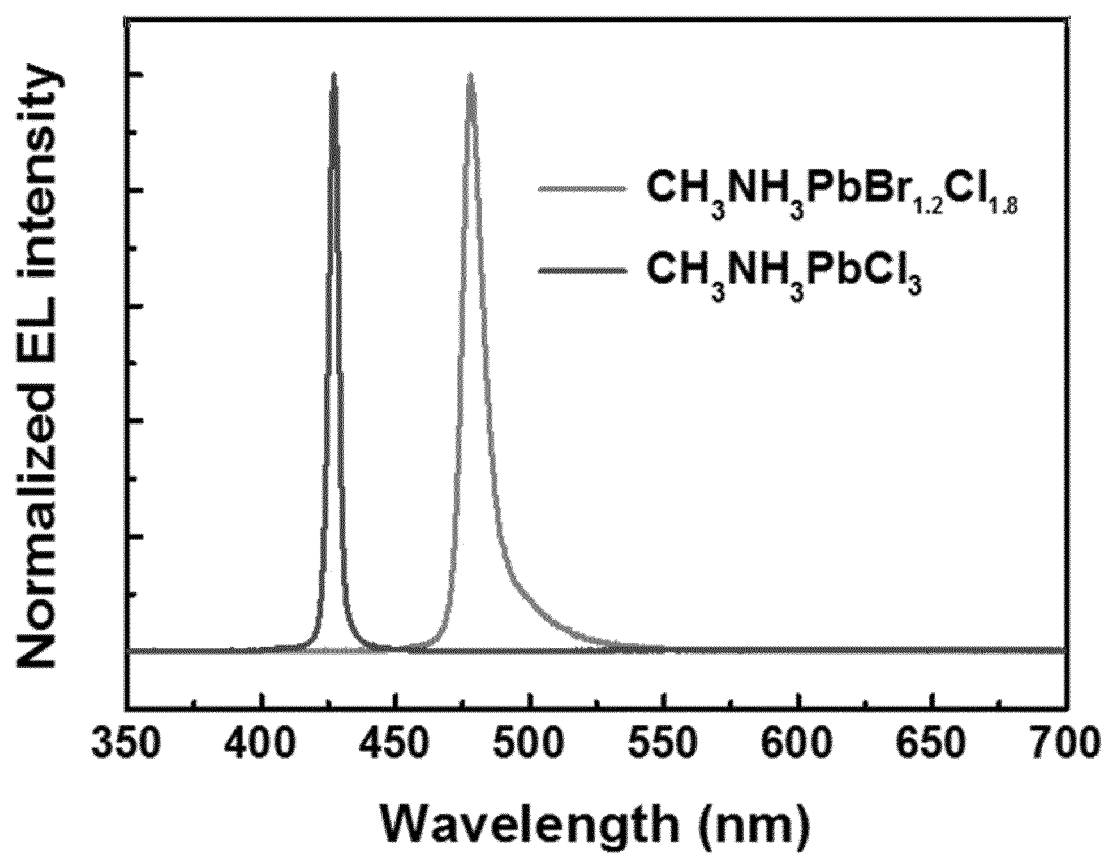
FIG. 18 is a plot of electroluminescence versus wavelength for a ITO/ZnO/PEI/$CH_3NH_3PbBr_{1.2}Cl_{1.8}$/CBP/$MoO_3$/Au device and a ITO/ZnO/PEI/$CH_3NH_3PbCl_3$/CBP/$MoO_3$/Au device.

FIG. 18 shows electroluminescence spectra for the devices prepared in this manner. As can be seen, the device prepared using $CH_3NH_3PbBr_{1.2}Cl_{1.8}$ had peak luminescence at about 480 nm in the blue region, thus enabling blue LEDs to be prepared.

Example Structure 5

Using a similar procedure to Example 2, a device with the following architecture was prepared: ITO/PEDOT:PSS/perovskite/CBP/Ca/Ag. The example device comprises a hole injecting layer like-PEDOT:PSS (30 nm) coated on to a transparent ITO-coated glass conducting substrate, followed by a perovskite ($CH_3NH_3PbBr_{3-x}Cl_x$) layer (80 nm). A layer of electron injection material like 4,4'-bis(N-carbazolyl)-1,1'-biphenyl (CBP) (40 nm) was deposited onto the perovskite film followed by calcium (25 nm) and silver (Ag) (150 nm) electrode for electrical contact.

Figure 19A:
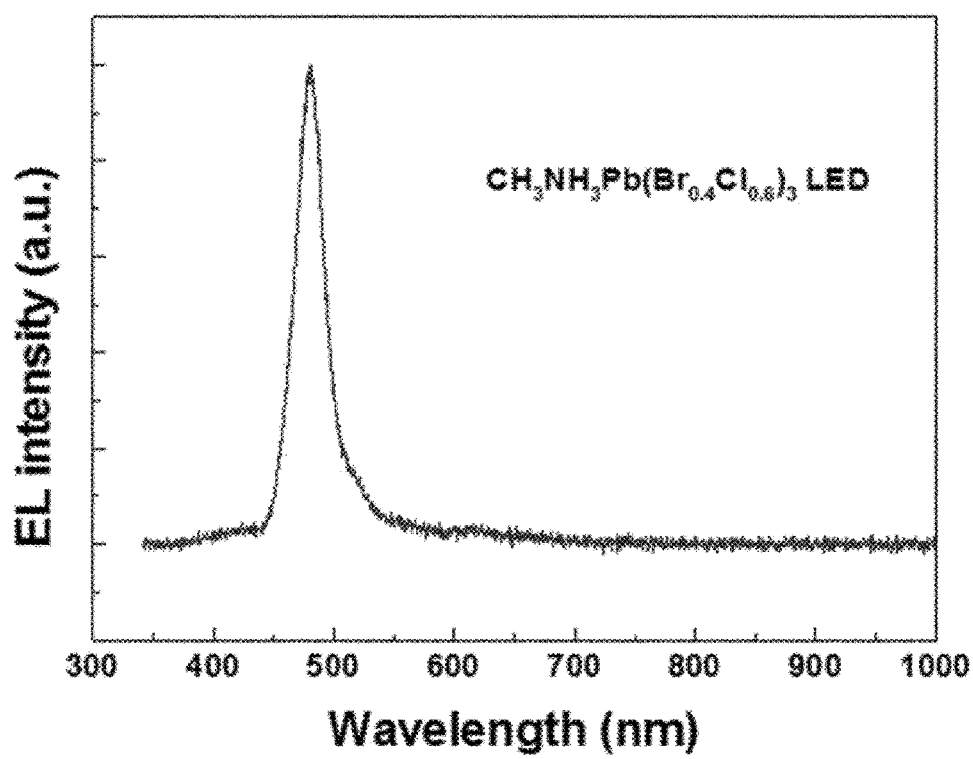
FIG. 19a is a plot of electroluminescence versus wavelength for a ITO/PEDOT:PSS/$CH_3NH_3Pb(Br_{0.4}Cl_{0.6})_3$/CBP/Ca/Ag device.

The electroluminescence spectrum for a LED with the above device structure comprising the perovskite $CH_3NH_3Pb(Br_{0.4}Cl_{0.6})_3$ is shown in FIG. 19a, with a peak at approximately 490 nm in the blue region of the spectrum.

Figure 19B:
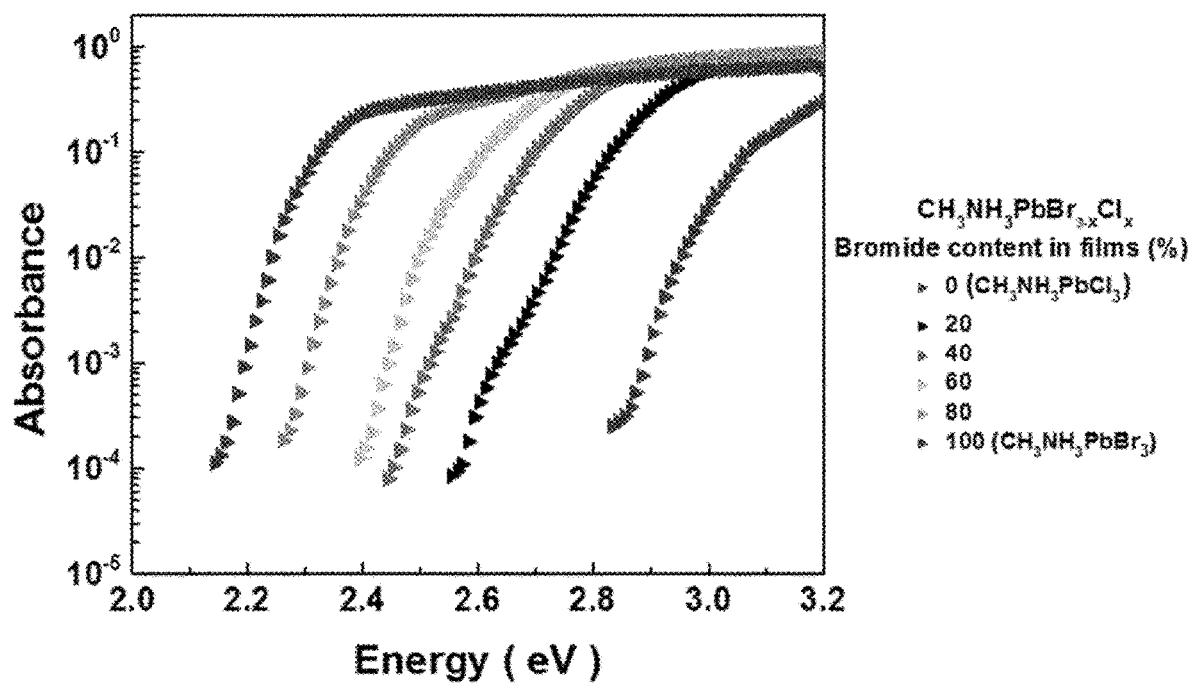
FIG. 19b is a plot of absorbance against energy (eV) for each of a series of devices comprising the architecture ITO/PEDOT:PSS/peroskite/CBP/Ca/Ag device wherein the thin perovskite films have the formula $CH_3NH_3PbBr_{3-x}Cl_x$ and the bromide content varies between 0% and 100%.

A series of devices were prepared of the formed above comprising a thin emissive perovskite layer having the formula $CH_3NH_3PbBr_{3-x}Cl_x$ in which the bromide content in the films was varied between 0% and 100%. Using photothermal deflection spectroscopy, it was possible to prepare a plot of absorbance against energy (eV) for each of the thin perovskite films. As can be seen from FIG. 19b, the materials show clear absorption edges with a shift towards blue as the percentage of bromide in the film increased.

Materials and Fabrication Techniques

When the perovskite materials described above are used in the manufacture of organic optoelectronic devices, they are preferably dissolved to form solutions. The solutions may be used in solution processing techniques to form the active/emissive layer of such devices. The electrodes of the PeLEDs may be deposited by thermal evaporation. The emissive layer, the hole injecting layer and/or interlayer(s)

may be deposited by solution processing, e.g. spin coating. Preferred devices of the invention are also encapsulated to avoid ingress of moisture and oxygen. Conventional encapsulation techniques may be used.

The PeLED substrate may be formed from any material conventionally used in the art such as glass or plastic. Optionally the substrate is pre-treated to improve adhesion thereto. Preferably the substrate is transparent. Preferably the substrate also has good barrier properties to prevent ingress of moisture or oxygen into the device.

The anode may comprise any material with a workfunction suitable for injection of holes into the light emitting layer. Preferably the anode is transparent. Representative examples of materials for use as a transparent anode include indium tin oxide (ITO) and indium zinc oxide (IZO). If the anode is not required to be transparent (e.g. if the cathode is transparent or it is a bottom emitting device) then opaque conducting materials such as opaque metals may be used as the anode.

The anode may comprise a single layer or may comprise more than one layer. For example, the anode may comprise a first anode layer and an auxiliary conductive layer between the anode and the hole injection layer such as a layer of organic conductive material between the anode and the hole injection layer.

The anode may be deposited on the substrate by thermal evaporation. The anode may be between 10 nm to 200 nm thick.

The hole injection layer may be deposited by a solution-based processing method. Any conventional solution-based processing method may be used. Representative examples of solution-based processing methods include spin coating, dip coating, slot die coating, doctor blade coating and ink-jet printing. In embodiments, spin coating is the preferred deposition method. The parameters used for spin coating the hole injection layer such as spin coating speed, acceleration and time are selected on the basis of the target thickness for the layer.

After deposition, the hole injection layer is preferably annealed by heating, e.g. at 150 to 200° C. for 5 to 30 minutes in air. The thickness of the hole injection layer may be 15 to 100 nm, or between 30 to 50 nm.

As mentioned above, the devices may incorporate a thin insulating layer formed between either or both of the electrodes and the light-emitting layer. The insulating layer is preferably formed of an oxide or nitride, and more preferably the insulating layer is selected from the group consisting of aluminium oxide, silicon dioxide, silicon nitride, zinc oxide, nickel oxide or magnesium oxide. The interlayer can play an important role in improving the device efficiency and the lifetime of LEDs (because exciton quenching at the interface between the charge injecting layer(s) and the emissive layer is prevented or minimised). Preferably, the insulating layer is deposited by atomic layer deposition, ALD.

The light-emitting (emissive) layer may be prepared by depositing a solution as hereinbefore defined on the charge injecting layer or, when present, the interlayer. Any conventional solution-based processing method may be used. Representative examples of solution-based processing methods include spin coating, dip coating, slot die coating, doctor blade coating and ink-jet printing. In embodiments, the depositing is by spin coating. The parameters used for spin coating the light emitting layer such as spin coating speed, acceleration and time are selected on the basis of the target thickness for the light emitting layer. After depositing, the light emitting layer is preferably dried, e.g. at 100-150° C. in a glove box. The thickness of the light emitting layer may be between 50 to 350 nm or between 75 to 150 nm.

The cathode may comprise any material having a workfunction allowing injection of electrons into the light-emitting layer. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977. The cathode may consist of a single material such as a layer of gold. Alternatively, it may comprise a plurality of metals, for example a bilayer or trilayer of a low workfunction material and a high workfunction material such as calcium and aluminium as disclosed in WO 98/10621; elemental barium as disclosed in WO 98/57381, Appl. Phys. Lett. 2002, 8 1(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of a hole injecting material that is sufficiently thin to be transparent. Typically, the lateral conductivity of this layer will be low as a result of its thinness. In this case, a layer of hole injecting material is used in combination with a thicker layer of transparent conducting material such as indium tin oxide.

The cathode may be deposited by thermal evaporation. The cathode may be 100 to 400 nm thick, or between 200 to 350 nm thick.

Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A material for absorption of any atmospheric moisture and/or oxygen that may permeate through the substrate or encapsulant may optionally be disposed between the substrate and the encapsulant.

$CH_3NH_3PbI_{3-x}Cl_x$ Perovskite Synthesis.

Methylammonium iodide ($CH_3NH_3I$) was prepared by adding 33 wt % methylamine solution in ethanol (24 mL) and 57 wt % hydroiodic acid in water (10 mL) to 100 mL of absolute ethanol. The reaction mixture was stirred at room temperature in a nitrogen atmosphere. The solvent was removed by rotary evaporation until white crystals started to appear. The product was collected using Büchner funnel filtration and was dried overnight under vacuum at 80° C. The mixed halide perovskite precursor solution was prepared by mixing $CH_3NH_3I$ and $PbCl_2$ in a 3:1 molar ratio in anhydrous N,N-dimethylformamide to give a concentration of 5 wt %.

$CH_3NH_3PbBr_3$ Perovskite Synthesis.

Methylammonium bromide ($CH_3NH_3Br$) was prepared by adding 33 wt % methylamine solution in ethanol (24 mL) and 48 wt % hydrobromic acid in water (8.5 mL) to 100 mL of absolute ethanol. The reaction mixture was stirred at room temperature. The solvent was removed by rotary evaporation. The obtained white crystals were washed with anhydrous diethyl ether and recrystallized in ethanol. The perovskite precursor solution was prepared by mixing $CH_3NH_3Br$ and $PbBr_2$ in a 3:1 molar ratio in anhydrous N,N-dimethylformamide to give a concentration of 5 wt %. For the $CH_3NH_3PbBr_2I$ mixed-halide precursor solution, the individual $CH_3NH_3PbBr_3$ and $CH_3NH_3PbI_3$ precursor solutions were mixed in a molar ratio of 2:1 to give an overall concentration of 5 wt %.

$CH_3NH_3PbBr_{3-x}Cl_x$ Perovskite Synthesis.

$CH_3NH_3PbBr_3$ precursor solution was synthesised by mixing $CH_3NH_3Br$ and $Pb(CH_3COO)_2$ in 5:1 molar stoichiometric ratio in N,N-Dimethylformamide (DMF) to get a 0.5 M solution. Similarly, the $CH_3NH_3PbCl_3$ precursor solution was synthesised by mixing $CH_3NH_3Cl$ and $Pb(CH_3COO)_2$ in 5:1 molar stoichiometric ratio in a mixed solvent comprising of dimethyl sulfoxide (DMSO) and DMF in the ratio of 40:60 v/v to get a 0.5M solution. To make the desired $CH_3NH_3PbBr_{3-x}Cl_x$ [$0 \le x \le 1$] precursor solutions the above mentioned $CH_3NH_3PbBr_3$ and $CH_3NH_3PbCl_3$ precursor solutions were mixed together in the required stoichiometric ratios.

Figure 4:
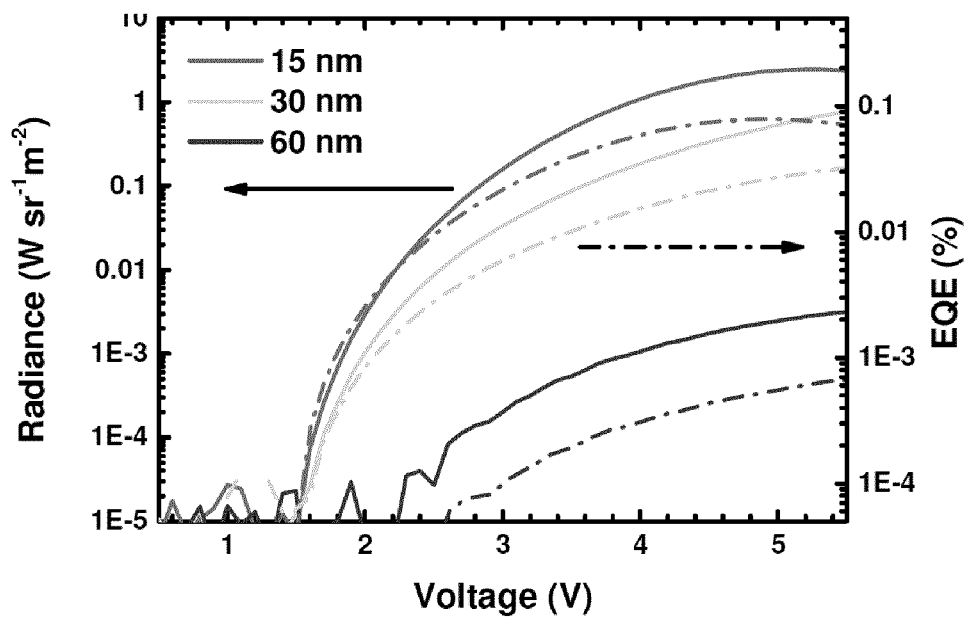
FIG. 4 shows how brightness and quantum efficiency of the light-emitting devices decreases with increasing perovskite thickness.

In embodiments, the perovskite layer is thin (<100 nm) in order to achieve efficient electroluminescence. To demonstrate this, devices were fabricated using thicker perovskite films. As shown in FIG. 4, the brightness and quantum efficiency of the devices decrease markedly at larger perovskite thicknesses, demonstrating the preference for spatial confinement of charges to ensure a high rate of electron-hole capture and radiative recombination. In addition, reabsorption losses are likely to be lower in the thinner films.

Figure 5:
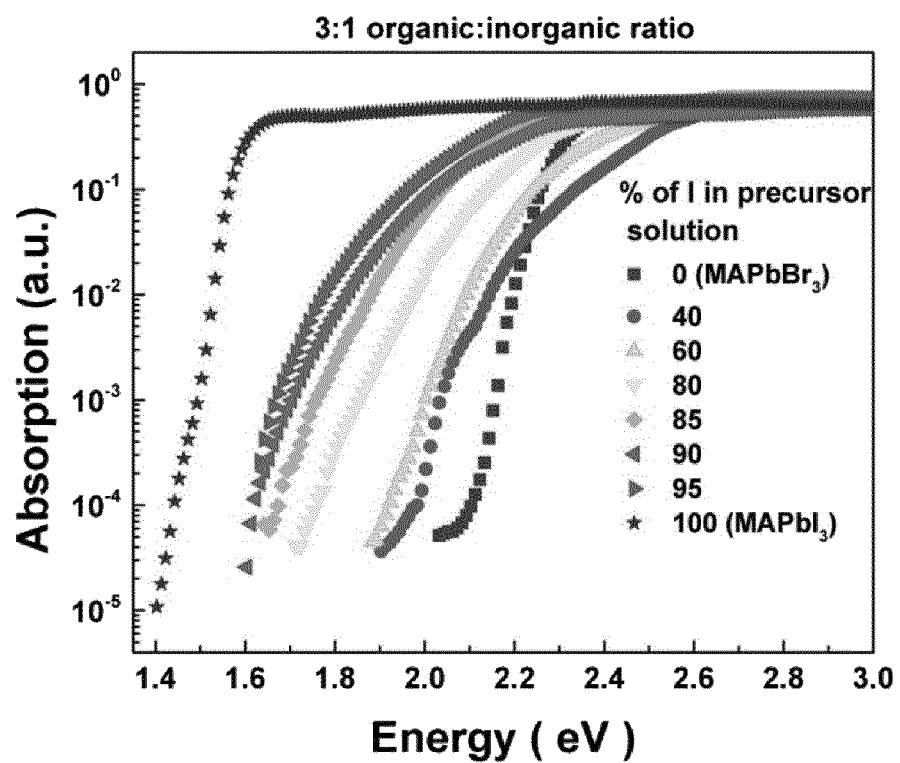
FIG. 5 shows the optical absorption of the perovskite with different compositions of bromide and iodide.

Preferably, the perovskite is prepared such that it consists of a single homogenous phase, which may achieve efficient emission. Photothermal deflection spectroscopy (PDS) technique was used to determine the absorption spectra of various methyl ammonium mixed halide perovskite films, and to determine the homogeneity of the perovskite layer. FIG. 5 shows the optical absorption of the perovskite with different compositions of bromide and iodide (measured using PDS). The absorption spectra shows a clean band-gap with no detectable absorption from the neat iodide ($CH_3NH_3PbI_3$) phase up to the detection limit of 5 orders of magnitude below the band edge absorption, demonstrating a clean band-edge and hence a homogenous perovskite phase (i.e. no areas with more concentrated amounts of bromide or iodide).

Figure 6:
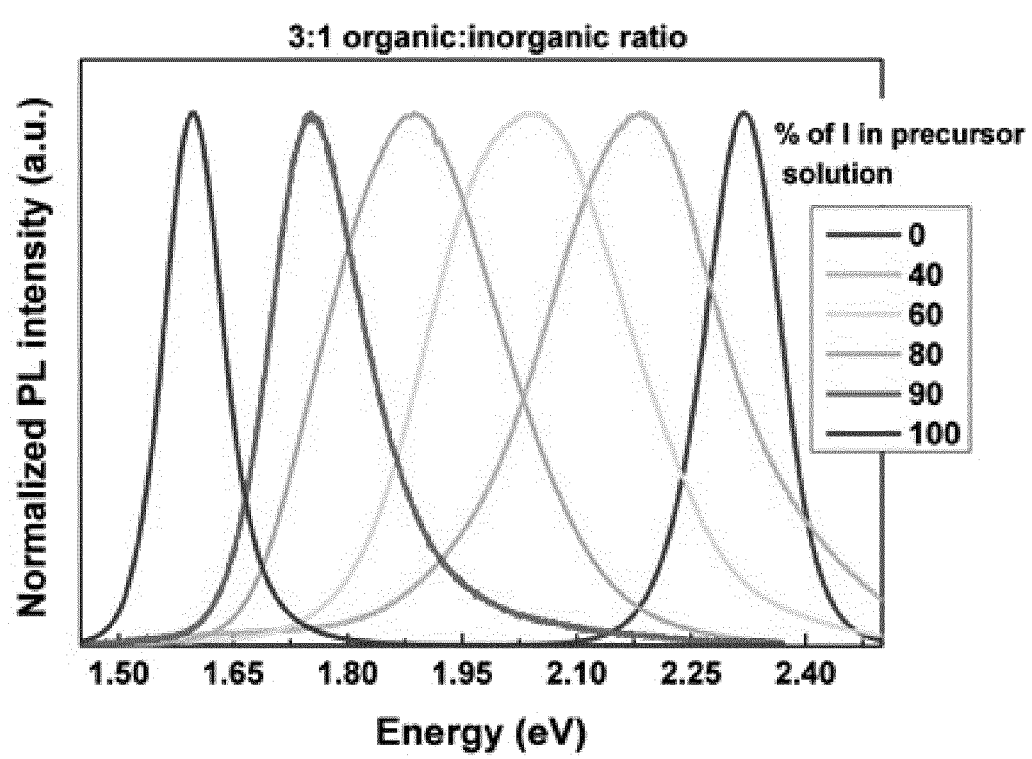
FIG. 6 shows the photoluminescence spectra of mixed and pure halide perovskite samples.

FIG. 6 shows the photoluminescence spectra of the mixed and pure halide perovskite samples. The spectra show sharp and well-defined emission peaks, even in the mixed halide perovskite samples, indicating the presence of homogenous composition throughout the perovskite layer. If more than one phase/type of the perovskite was present within the layer, there would be an appearance of two or more emission peaks.

Infrared PeLED Fabrication.

ITO coated glass substrates were cleaned successively with acetone and isopropanol. $TiO_2$ (25 nm) was grown onto the cleaned substrates at 225° C. with atomic layer deposition (ALD), using titanium tetrachloride ($TiCl_4$) and water as precursors. The substrates were transferred into a nitrogen filled glovebox for further fabrication. The $CH_3NH_3PbI_3Cl_x$ perovskite precursor solution was spin coated onto the $TiO_2$ at 3000 rpm for 60 seconds, and annealed at 100° C. for 5 minutes to give a thin perovskite film with an average thickness of ~15 nm, as determined by atomic force microscopy (AFM). A solution of F8 in chlorobenzene (10 mg/mL) was spin coated onto the perovskite layer at 3000 rpm for 60 seconds to give a 50 nm film. $MoO_3$ (5 nm) and Ag (100 nm) were successively deposited by vacuum thermal evaporation. Devices were tested in air without encapsulation.

Green PeLED Fabrication.

ITO coated glass substrates were cleaned successively with acetone and isopropanol, followed by 10 minutes oxygen plasma treatment. PEDOT:PSS (Clevios P VP AI 4083) was spin coated onto the substrate at 6000 rpm for 30 seconds, and annealed at 140° C. for 30 minutes in a nitrogen atmosphere. The $CH_3NH_3PbBr_3$ perovskite precursor solution was spin coated onto PEDOT:PSS at 3000 rpm for 30 seconds and annealed at 100° C. for 15 minutes to give a perovskite film thickness of ~20 nm. A solution of F8 in chlorobenzene (10 mg/mL) was spin coated onto the perovskite layer at 3000 rpm for 30 seconds to give a 50 nm film. Ca (20 nm) and Ag (100 nm) were successively deposited by vacuum thermal evaporation. Devices were tested in air without encapsulation.

PeLED Characterization.

Current vs. voltage characteristics were measured using a Keithley 2400 Source Measure Unit (SMU). Photon flux was measured simultaneously using a calibrated silicon photodiode centered over the light-emitting pixel. Radiance in $W\ sr^{-1}\ m^{-2}$ and luminance in $cd\ m^{-2}$ were calculated based on the emission function of the PeLED, and on the known spectral response of the silicon photodiode. External quantum efficiency was calculated, assuming a Lambertian emission profile. Electroluminescence spectra were measured using a Labsphere CDS-610 spectrometer.

PLQE Measurement.

The PLQE of the thin film samples was measured using an integrating sphere method, as reported in the literature (de Mello, J. C.; Wittmann, H. F.; Friend, R. H. *Advanced Materials* 1997, 9, 230). A continuous wave 532 nm green diode laser with an excitation power of 10-100 mW and a focused beam spot of ~0.3 $mm^2$ was used to photo-excite the samples. Emission was measured using an Andor iDus DU490A InGaAs detector. During measurements, the samples were kept at room temperature under a constant stream of nitrogen. Samples were prepared in the structure $TiO_2/CH_3NH_3PbI_{3-x}Cl_x/F8$ on top of a spectrosil fused silica substrate, similar to the PeLED device structure.

Pulse LED Measurement.

A square voltage pulse with a pulse width of 1 ms and frequency of 100 Hz was applied to the device using a HP8116A Pulse/Function generator. A dual-channel Agilent Technologies DSO6032A oscilloscope, set to 50Ω impedance, was connected in series to the device and the function generator to determine the current through the device. The electroluminescence was monitored using a calibrated Si photodiode, connected to the $2^{nd}$ channel of the oscilloscope (1 MΩ) via a Thorlabs PDA200C photodiode amplifier.

SUMMARY

The demonstration of bright visible and infrared electroluminescence from organometal halide based perovskite using the devices of the present invention shows great promise in the development of this class of materials for large area optoelectronic or electrically-pumped lasing applications. Furthermore, this work exemplifies the fact that an efficient solar cell material is generally also a good light emitter, as given by the Shockley-Queisser detailed balance limit calculations (W. Shockley and H. J. Queisser, *Journal of Applied Physics* 1961, 32, 510, and O. D. Miller et al, *Photovoltaics, IEEE Journal of* 2012, 2, 303).

It is interesting that bright electroluminescence could be achieved using a simple thin emitter realized by solution processing. Given the versatility and low-cost, simple processability at room temperature of these organometal halide perovskite materials, they may quickly find their way into the displays and lighting industry.

No doubt many other effective alternatives within the scope of the presently claimed invention will occur to the skilled person. It will be understood that the invention is not limited to the described embodiments and encompasses modifications apparent to those skilled in the art lying within the spirit and scope of the claims appended hereto.

The invention claimed is:

1. A solid state light-emitting device comprising:
a first electrode coupled to a first charge injecting layer;
a second electrode coupled to a second charge injecting layer;
an emissive layer comprising an organometal halide perovskite material or a metal halide perovskite material, wherein the emissive layer is provided between the first and second charge injecting layers; and
wherein the optical bandgaps of the first and second charge injecting layers are larger than the optical bandgap of the emissive perovskite layer;
wherein said organometal halide perovskite material or metal halide perovskite material contains an $AMX_3$ unit cell, where A is a monovalent organic cation or a monovalent metal cation, M is a divalent cation and X is a halide anion; and
wherein at least one of the charge injecting layers form a type-I heterojunction with the emissive layer.

2. A solid state light-emitting device comprising:
a first electrode coupled to a first charge injecting layer;
a second electrode coupled to a second charge injecting layer;
an emissive layer comprising an organometal halide perovskite material or a metal halide perovskite material, wherein the emissive layer is provided between the first and second charge injecting layers; and
wherein the first charge injecting layer consists essentially of a hole injecting polyelectrolyte, and the second charge injecting layer has an optical bandgap that is larger than the optical bandgap of the emissive perovskite layer;
wherein said organometal halide perovskite material or metal halide perovskite material contains an $AMX_3$ unit cell, where A is a monovalent organic cation or a monovalent metal cation, M is a divalent cation and X is a halide anion; and
wherein at least one of the charge injecting layers form a type-I heterojunction with the emissive layer.

3. A solid state light-emitting device as recited in claim 1 wherein at least one of the charge injecting layers has an optical bandgap of from 1.5 eV to 5 eV.

4. A solid state light-emitting device as recited in claim 1 wherein the emissive layer has a thickness of less than 100 nm.

5. A solid state light-emitting device as recited in claim 1 wherein at least one of the charge injecting layers is formed of a semiconducting material.

6. A solid state light-emitting device as recited in claim 1 wherein at least one of the charge injecting layers is formed of an organic semiconducting material.

7. A solid state light-emitting device as recited in claim 1 wherein a charge injecting layer consists essentially of a hole injecting organic semiconducting material and is selected from the group consisting of PEDOT:PSS, PANI (polyaniline), polypyrrole, substituted polypyrrole, doped poly(ethylene dioxythiophene) (PEDOT).

8. A solid state light-emitting device as recited in claim 1 wherein a charge injecting layer consists essentially of an electron injecting organic semiconducting material and is selected from the group consisting of poly(fluorene)s, including F8, TFB, F8BT or F8-TFB AB copolymer (95:5 F8:TFB).

9. A solid state light-emitting device as recited in claim 1 wherein the charge injecting layer is an electron injecting inorganic semiconducting material and is selected from the group consisting of titanium dioxide ($TiO_2$), zinc oxide (ZnO), magnesium zinc oxide (MgZnO) and aluminium-doped ZnO (AZO).

10. A solid state light-emitting device as recited in claim 1 wherein the charge injecting layer is a hole injecting organic semiconducting material and is selected from the group consisting of polyfluorenes (preferably F8, TFB, PFB or F8-TFB) or Spiro-OMeTAD or polycarbazole (preferably poly(9-vinylcarbazole)) or 4,4'-Bis(N-carbazolyl)-1,1'-biphenyl.

11. A solid state light-emitting device as recited in claim 1 wherein at least one of the first and second electrodes is formed of a transparent conductive material.

12. A solid state light-emitting device as recited in claim 11 wherein the first electrode is an anode and the transparent conductive material is selected from:
indium tin oxide (ITO), fluorine doped tin oxide (FTO), indium zinc oxide, graphene, carbon nanotubes, and a metal with a thickness of less than 20 nm.

13. A solid state light-emitting device as recited in claim 1 wherein there is an insulating layer formed between either or both of the charge injecting layers and the light-emitting layer.

14. A solid state light-emitting device as claimed in claim 13 wherein the insulating layer is formed of an oxide or nitride and has a thickness of less than 30 nm.

15. A solid state light-emitting device as recited in claim 13 wherein the insulating layer consists essentially of aluminium oxide, silicon dioxide, silicon nitride, zinc oxide modified with aluminium oxide, nickel oxide or magnesium oxide.

16. A solid state light-emitting device as recited in claim 13 wherein the insulating layer consists essentially of poly (ethyleneimine) (PEI), polyethylenimine-ethoxylated (PEIE), polystyrene (PS) or poly(methylmethacrylate) (PMMA).

17. A solid state light-emitting device as claimed in claim 13 wherein the insulating layer is deposited by atomic layer deposition, ALD.

18. A device according to claim 1, wherein a thin layer of <30 nm of a material selected from molybdenum trioxide or tungsten trioxide is deposited:
between a first charge injecting layer and a first electrode,
between a second charge injecting layer and a second electrode,
between a first charge injecting layer and an emissive layer,
between a second charge injecting layer and an emissive layer,
between a first electrode and an emissive layer, or
between a second electrode and an emissive layer.

19. A solid state light-emitting device as claimed in claim 1 wherein said organometal halide perovskite or metal halide perovskite has an $AMX_3$ structure, where A is a monovalent organic cation or a monovalent metal cation, M is a divalent cation and X is a halide anion.

20. A solid state light-emitting device as claimed in claim 1 wherein divalent cation M is a divalent metal cation.

21. A solid state light-emitting device as claimed in claim 20 wherein the divalent metal cation is tin ($Sn^{2+}$) or lead ($Pb^{2+}$).

22. A solid state light-emitting device as recited in claim 1, wherein the monovalent organic cation is a primary, secondary or tertiary ammonium cation $[HNR^1R^2R^3]^+$, wherein each of $R^1$, $R^2$ and $R^3$ may be the same or different and is selected from hydrogen, an unsubstituted or substituted $C_1$-$C_{20}$ alkyl group and an unsubstituted or substituted $C_5$-$C_{18}$ aryl group.

23. A solid state light-emitting device as recited in claim 1, wherein the monovalent organic cation is of the form $[R^1R^2N\text{---}CH\text{=}NR^3R^4]^+$:

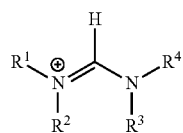

wherein each of $R^1$, $R^2$, $R^3$ and $R^4$ may be the same or different and is selected from hydrogen, an unsubstituted or substituted $C_1$-$C_{20}$ alkyl group and an unsubstituted or substituted $C_5$-$C_{18}$ aryl group.

24. A solid state light-emitting device as recited in claim 1, wherein the monovalent organic cation is of the form $(R^1R^2N)(R^3R^4N)c\text{=}N^+R^5R^6$:

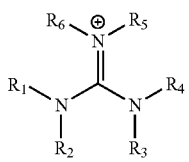

wherein each of $R^1$, $R^2$, $R^3$, $R^4$, $R^5$ and $R^6$ may be the same or different and is selected from hydrogen, an unsubstituted or substituted $C_1$-$C_{20}$ alkyl group and an unsubstituted or substituted $C_5$-$C_{18}$ aryl group.

25. A solid state light-emitting device as recited in claim 1, wherein the monovalent metal cation is an alkali metal cation.

26. A solid state light-emitting device as recited in claim 1, wherein the monovalent metal cation is caesium ($Cs^+$) or rubidium ($Rb^+$).

27. A solid state light-emitting device as recited in claim 1, wherein X is a halide anion selected from chloride, bromide, iodide, and fluoride and, in the $AMX_3$ unit cell each halide may be the same or different.

28. A solid state light-emitting device as recited in claim 1, wherein the organometal halide perovskite material or metal halide perovskite material contains an $A_{1-i}BMX_3$ unit cell, wherein:
A and B are each a monovalent organic cation or a monovalent metal cation as claimed in any one of claims 22 to 26, where A and B are different;
M is a divalent metal cation;
X is a halide anion; and
i is between 0 and 1.

29. A solid state light-emitting device as recited in claim 1, wherein the organometal halide perovskite material or metal halide perovskite material contains an $AMX_{3-k}Y_k$ unit cell, wherein:

A is a monovalent cation;
M is a divalent metal cation;
X and Y are each a halide anion, where X and Y are different; and
k is between 0 and 3.

30. A solid state light-emitting device as recited in claim 1, wherein the organometal halide perovskite material or metal halide perovskite material contains an $AM_{1-j}N_jX_3$ unit cell, wherein:
A is a monovalent cation;
M and N are each a divalent metal cation;
X is a halide anion; and
j is between 0 and 1.

31. A solid state light-emitting device as recited in claim 1, wherein the organometal halide perovskite material or metal halide perovskite material contains an $A_{1-i}B_iM_{1-j}N_jX_{3-k}Y_k$ unit cell, wherein:
A and B are each a monovalent cation, where A and B are different;
M and N are each a divalent metal cation;
X and Y are each a halide anion, where X and Y are different; and
where i is between 0 and 1, j is between 0 and 1, and k is between 0 and 3.

32. A method of manufacturing a solid state light-emitting device, the method comprising:
providing a first electrode on a substrate;
depositing a first charge injecting layer over the first electrode;
depositing an emissive perovskite layer over the first charge injecting layer;
depositing a second charge injecting layer over the emissive perovskite layer; and
depositing a second electrode over the second charge injecting layer; and
wherein the bandgaps of the first and second charge injecting layers are larger than the bandgap of the emissive perovskite layer.

33. A method of manufacturing a solid state light-emitting device as claimed in claim 32 wherein the first electrode is an anode and is formed by the deposition of a transparent conductive material, preferably indium tin oxide (ITO) or fluorine doped tin oxide (FTO).

34. A method of manufacturing a solid state light-emitting device as claimed in claim 28 wherein the emissive perovskite layer is composed of a single, homogenous phase perovskite material.

35. A method of manufacturing a solid state light-emitting device as recited in claim 32 wherein the emissive layer has a thickness of less than 100 nm.

36. A method of manufacturing a solid state light-emitting device as recited in claim 32 wherein a thin insulating layer is deposited between either or both of the charge injecting layers and the light-emitting layer.

37. A method as claimed in claim 36 wherein the insulating layer is formed of an oxide or nitride and has a thickness of less than 30 nm.

38. A method as claimed in claim 36 wherein the insulating layer is selected from the group consisting of aluminium oxide, silicon dioxide, silicon nitride, zinc oxide modified with aluminium oxide, nickel oxide or magnesium oxide.

39. A method as claimed in claim 36 wherein the insulating layer is an insulating polymer selected from the group consisting of poly(ethyleneimine) (PEI), polyethylenimine-ethoxylated (PEIE), polystyrene (PS) and poly(methylmethacrylate) (PMMA).

40. A method as claimed in claim 36 wherein the insulating layer is deposited by atomic layer deposition, ALD.

41. A method of manufacturing a solid state light-emitting device as recited in claim 32 wherein at least one of the first charge injecting layer and the second charge injecting layer is formed of a semiconductor material.

42. A method of manufacturing a solid state light-emitting device as recited in claim 32 wherein a thin layer of <30 nm of a material selected molybdenum trioxide and tungsten trioxide is deposited between:
- the transparent conductive electrode and the perovskite layer,
- between a charge injecting layer and a conductive electrode,
- between the transparent conductive electrode and a charge injecting layer,
- between the perovskite layer and a charge injecting layer, or
- between the perovskite layer and a conductive electrode.

43. A method of manufacturing a solid state light-emitting device as recited in claim 32 wherein deposition of the layers is performed using one or more of the following deposition techniques: vacuum thermal evaporation, spin coating, direct-write printing, inkjet printing, lithographic patterning, and solution deposition.

44. An electronic device comprising an LED display, wherein the display comprises one or more light-emitting devices as recited in claim 1.

\* \* \* \* \*